(12) United States Patent
Sugiyama

(10) Patent No.: US 8,080,436 B2
(45) Date of Patent: Dec. 20, 2011

(54) LIGHT EMITTING DEVICE AND METHOD OF MANUFACTURING THE LIGHT EMITTING DEVICE

(75) Inventor: Takafumi Sugiyama, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/845,685

(22) Filed: Jul. 28, 2010

(65) Prior Publication Data

US 2011/0024786 A1   Feb. 3, 2011

(30) Foreign Application Priority Data

Jul. 30, 2009  (JP) .................................. 2009-177611
Aug. 3, 2009  (JP) .................................. 2009-180452

(51) Int. Cl.
*H01L 21/00* (2006.01)
*H01L 21/40* (2006.01)

(52) U.S. Cl. ................ 438/34; 438/46; 438/69; 438/82; 438/99; 438/110; 257/E21.002; 257/E21.299; 257/E21.527

(58) Field of Classification Search ........... 257/E21.002, 257/E21.299, E21.527, E31.095, E51.022
See application file for complete search history.

(56) References Cited

U.S. PATENT DOCUMENTS

| 2004/0214363 | A1* | 10/2004 | Matsubara et al. ............. 438/46 |
| 2005/0045903 | A1  | 3/2005  | Abe et al. |
| 2005/0082561 | A1* | 4/2005  | Suehiro et al. ................. 257/99 |
| 2006/0202220 | A1* | 9/2006  | Hayashi ........................... 257/98 |
| 2008/0149960 | A1* | 6/2008  | Amo et al. ...................... 257/98 |
| 2010/0155739 | A1  | 6/2010  | Kuramoto et al. |

FOREIGN PATENT DOCUMENTS

| JP | 2005-079329 | 3/2005 |
| JP | 2006-156704 | 6/2006 |
| WO | WO-2007/015426 A1 | 2/2007 |

* cited by examiner

*Primary Examiner* — Mohsen Ahmadi
(74) *Attorney, Agent, or Firm* — Foley & Lardner LLP

(57) ABSTRACT

A method of manufacturing a light emitting device includes: a first step of forming on a supporting substrate made of a stainless steel, a plurality of conductive members each including a first region containing Au and a second region containing a metallic member having a diffusion coefficient with respect to a metal in the stainless steel smaller than a diffusion coefficient of Au with respect to the metal in the stainless steel, a second step of forming a base member made of a light-blocking resin on the supporting substrate between the conductive members, a third step of bonding a light emitting element on an upper surface of a conductive member through an adhesive member, a fourth step of covering the light emitting element with an optically transmissive sealing member, and a fifth step of removing the supporting substrate and individually separating the light emitting devices.

9 Claims, 17 Drawing Sheets

LIGHT EMITTING DEVICE AND METHOD OF MANUFACTURING THE LIGHT EMITTING DEVICE

BACKGROUND OF THE INVENTION

1. Field of the Invention

Present invention relates to a light emitting device which can be used in indicator, lighting apparatus, display, backlight of LED display etc, and more particularly to a light emitting device of thin, compact type with excellent light extraction efficiency and good manufacturing yield, and a method of manufacturing the light emitting device.

2. Description of the Related Art

In compliance with the recent trend of reducing the size and weight of electronic devices, various kinds of small sized light emitting devices (light emitting diodes), charge-coupled devices (CCD), and the like, to be mounted on such an electronic device have been developed. Such a light emitting device has a structure which includes, for example, a double-sided through-hole printed-circuit board having a pair of metallic conductor patterns formed on the both surfaces of an insulator substrate and a light emitting element mounted on the double-sided through-hole printed-circuit board, and the metallic conductive patterns and the light emitting element are electrically connected respectively by using a wire and the like.

However, such a light emitting device requires the use of double-sided through-hole printed-circuit board which has a thickness of about 0.1 mm or more, which is a factor that interferes with the goal of drastically reducing the thickness of the surface-mounted light emitting device. For this reason, light emitting devices having a structure without using such a printed-circuit board have been developed.

SUMMARY OF THE INVENTION

Reduction in thickness compared with conventional surface mounted type light emitting devices was obtained in the light emitting device disclosed in JP 2005-79329A, by forming thin metallic films on a substrate as electrodes by using a method such as a vapor deposition, and sealing the electrodes together with a light emitting element using an optically transmissive resin.

However, only optically transmissive resin is used, light extraction efficiency likely so that light from the light emitting element escapes from the light emitting element though the bottom surface out through the lower surface and the light extraction efficiency tends to decrease. A structure provided with a cone-shaped metallic film to reflect light is also disclosed, but an irregular surface configuration is required on the substrate to dispose such a metallic film. In such a case, because the size of the light emitting device is reduced, the irregular surface configuration is microscopic, which may not only hinder the processing but also may cause problems such as that the device becomes prone to break at the time of removing the substrate due to the irregular structure, and mat result in a yield loss. In a case where the light emitting device is used in a display etc., low contrast may result when only the optically transmissive resin is used.

Also, in recent years, further higher output power generation has been in demand and the output power of light emitting element is improving. However, the amount of heat generated with high power emission is also increasing. Accordingly, each member constituting the light emitting device is required to have heat-resistant properties.

In order to solve the problems described above, a method of manufacturing a light emitting device according to a first aspect of the present invention includes a first step of forming a plurality of conductive members spaced apart from each other on a supporting substrate made of a stainless steel. The conductive member includes a first region which contains Au and a second region which is interposed between at least a part of the first region and the supporting substrate. The second region contains a metallic member having a diffusion coefficient with respect to a metal contained in the stainless steel smaller than a diffusion coefficient of Au with respect to the metal contained in the stainless steel. This method of manufacturing also includes a second step of forming a base member made of a light-blocking resin on the supporting substrate at locations having the first region of conductive member, a third step of bonding a light emitting element respectively on an upper surface of the first region of conductive member through an adhesive member, a forth step of covering the light emitting element with an optically transmissive sealing member, and a fifth step of removing the supporting substrate so as to expose at least a part of the first region of conductive member and individually separating each light emitting device.

A method of manufacturing a light emitting device according to a second aspect of the present invention includes a first step of, on a supporting substrate made of a stainless steel, forming a metallic layer containing a metal having a diffusion coefficient with respect to Au smaller than a diffusion coefficient of a metal contained in the supporting substrate with respect to Au, and forming a plurality of conductive members each including a first layer having Au as its main component and formed on the metallic layer and a second layer containing a metal other than Au and formed on the first layer. The method also includes a second step of forming a plurality of base members made of a light-blocking resin on the supporting substrate at locations between the conductive members, a third step of mounting a plurality of light emitting elements on each upper surface of the plurality of conductive members or base members through an adhesive member, and applying heat at a temperature lower than the melting point of the metallic layer to melt the adhesive member, a fourth step of covering the light emitting elements with an optically transmissive sealing member, and a fifth step of removing the supporting substrate by detaching between the metallic layer and the first layer and individually separating each light emitting device. With this, light emitting devices of thin type with high luminous efficiency and excellent heat-resistant properties can be obtained with good yield.

In a method of manufacturing a light emitting device according to a third aspect of the present invention, it is preferable in the first step that after forming the metallic layer on the supporting substrate, a protective film defining a plurality of openings is formed and the conductive member is disposed in each opening.

In a method of manufacturing a light emitting device according to a fourth aspect of the present invention, it is preferable in the first step that after forming a protective film defining a plurality of openings on the supporting substrate, the metallic layer is disposed in each opening.

In a method of manufacturing a light emitting device according to a fifth aspect of the present invention, it is preferable that the first step preferably includes a step of applying heat at a temperature higher than the heating temperature in the third step.

In a method of manufacturing a light emitting device according to a sixth aspect of the present invention, the metallic layer preferably contains one selected from Ti, Pt, Pd, Al, Rh, and Mo.

In a method of manufacturing a light emitting device according to a seventh aspect of the present invention, the adhesive member is preferably a eutectic material.

A method of manufacturing a light emitting device according to an eighth aspect of the present invention includes a first step of forming on a supporting substrate made of a stainless steel a plurality of conductive members having a bottom layer which includes a first region containing Au and a second region containing a metallic member having a diffusion coefficient with respect to a metal in the stainless steel smaller than a diffusion coefficient of Au with respect to the metal in the stainless steel, a second step of forming a base member made of a light-blocking resin on the supporting substrate at locations between the conductive members, a third step of bonding a plurality of light emitting elements on each upper surface of the plurality of conductive members or base members via an adhesive member, and a fourth step of covering the light emitting elements with an optically transmissive sealing member, and a fifth step of removing the supporting substrate by detaching between the metallic layer and the first layer and individually separating each light emitting device. With this, light emitting devices of small size and thin type can be manufactured with good yield.

In a method of manufacturing a light emitting device according to a ninth aspect of the present invention, the first step may include a step of forming the first region continuously on the supporting substrate and over the second region.

A method of manufacturing a light emitting device according to a tenth aspect of the present invention may further include a step of forming an intermediate layer including at least one layer containing a metal different from the metal contained in the bottom layer and a top layer on which a light emitting element to be mounted, in this sequence on the bottom layer by way of plating.

A light emitting device according to a eleventh aspect of the present invention includes a light emitting element, a conductive member having an upper surface on which the light emitting element is bonded through an adhesive member, and a base member holding the conductive member so as to expose a lower surface of the conductive member. The lower surface of the conductive member may contain at least Au.

In a light emitting device according to a twelfth aspect of the present invention, the lower surface of the conductive member includes a first region containing Au and a plurality of second regions containing a metallic member having a diffusion coefficient with respect to a metal in the stainless steel smaller than a diffusion coefficient of Au with respect to the metal in the stainless steel. With this, light emitting device of a small and thin type with excellent heat-resistant properties can be obtained.

In a light emitting device according to a thirteenth aspect of the present invention, the second region may contain a metallic member having a diffusion coefficient with respect to at least one metallic member selected from Fe, Ni, and Cr smaller than a diffusion coefficient of Au with respect to at least one metallic member selected from Fe, Ni, and Cr.

In a light emitting device according to a fourteenth aspect of the present invention, the second region may include at least one metallic member selected from Ti, Pt, Pd, Al, Rh, and Mo.

In a light emitting device according to a fifteenth aspect of the present invention, the conductive member is made of plated layers including a bottom layer having a lower surface including a first region and a second region, a top layer on which a light emitting element to be mounted, and an intermediate layer which is disposed between the bottom layer and the top layer and includes at least one layer made of a metal different from the metal constituting each of the bottom layer and the top layer.

In a light emitting device according to a sixteenth aspect of the present invention, the intermediate layer may include a first intermediate layer made of Ni or Cu and a second intermediate layer made of Au.

In a light emitting device according to a seventeenth aspect of the present invention, the base member is made of a thermosetting resin.

In a light emitting device according to a eighteenth aspect of the present invention, the base member may be made of a thermosetting resin composite containing a triazine derivative epoxy resin.

According to the present invention, a light emitting device of small size and thin type can be manufactured easily with good yield. Moreover, even with a thin-type light emitting device, light from a light emitting element can be prevented from leaking from an lower surface side, so that a light emitting device with improved light extraction efficiency and/or improved contrast can be obtained. Further, a light emitting device having excellent heat-resistant properties can be easily obtained.

The above and further objects of the present invention as well as the features thereof will become more apparent from the following detailed description to be made in conjunction with the accompanying drawings.

DETAILED DESCRIPTION OF THE EMBODIMENTS

The preferred embodiments of the present invention will be described below.

Embodiment 1

Figure 1A:
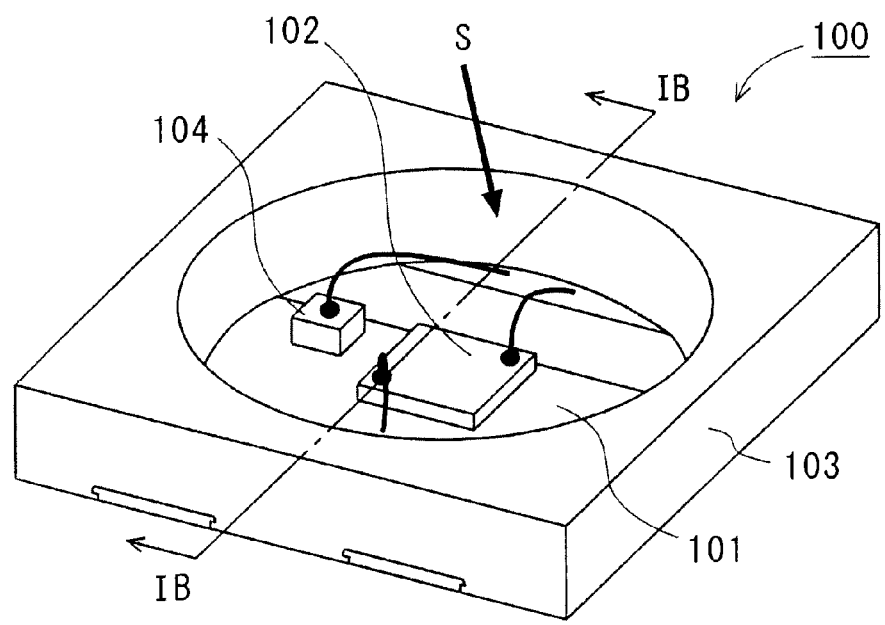
FIG. 1A is a perspective view showing a whole structure and inner structure of a light emitting device according to an embodiment of the present invention.
Figure 1B:
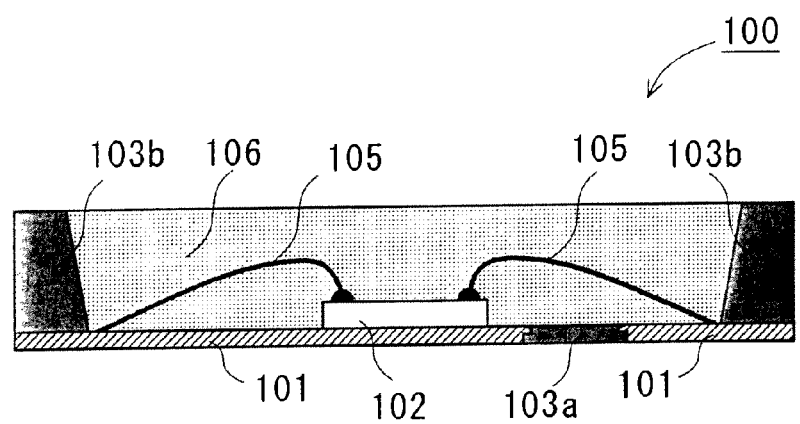
FIG. 1B is a cross sectional view of the light emitting device of FIG. 1A taken along the line IB-IB.

A light emitting device 100 of the present embodiment is shown in FIG. 1A and FIG. 1B. FIG. 1A is a perspective view of the light emitting device 100 and FIG. 1B is a cross-sectional view of the light emitting device 100 shown in FIG. 1A taken along the line IB-IB.

In the present embodiment, the light emitting device 100 includes a light emitting element 102, a pair of conductive members 101 each having an upper surface electrically connected to the light emitting element 102, and a base member 103 which is in contact with and holds the periphery of the conductive member 101. The base member 103 is made of a resin to which various filling materials having light blocking properties are added to block light from the light emitting element 102, and provided with a recess S defined by a bottom surface portion 103a and a side surface 103b. A part of the upper surface of each of a pair of conductive members 101 is exposed at the bottom surface of the recess S. The lower surface of each conductive member 101 is exposed from the lower surface (back surface) of the base member 103. The light emitting element 102 and each conductive member 101 are respectively electrically connected by a conductive wire 105 and a sealing member 106 is provided in the recess S to cover these electric constituent components.

Figure 1C:
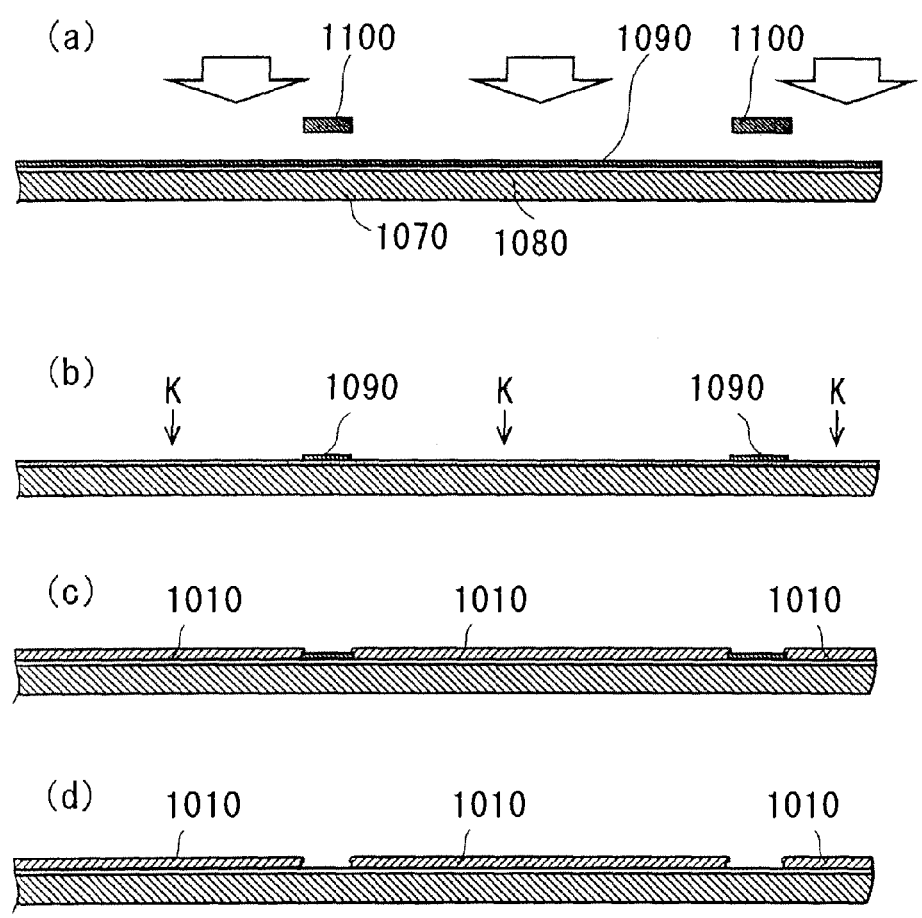
FIG. 1C(a) through FIG. 1C(d) are process diagrams illustrating a method of manufacturing a light emitting device according to an embodiment of the present invention.

The light emitting device 100 as described above can be obtained by using a method described below. FIGS. 1C(a) through 1C(d) and FIGS. 1D(a) through 1(d) are process diagrams each illustrating a method of manufacturing a group 1000 of light emitting devices, and the group 1000 of the light emitting devices are cut to obtain individual light emitting devices 100 as shown in FIG. 1A.

1. First Step

Firstly, as shown in FIG. 1C(a), a planar supporting substrate 1070 made of a stainless steel is prepared.

A metallic layer 1080 is formed on an upper surface of the supporting substrate. The metallic layer contains a metal having a diffusion coefficient with respect to Au smaller than a diffusion coefficient of a metal in the supporting substrate with respect to Au, and may be disposed by using a method such as plating, vapor deposition, sputtering, or the like, and is preferably formed on approximately the whole surface of the upper surface of the supporting substrate with sufficiently uniform thickness.

Next, a resist 1090 is applied on the surface of the metallic layer as a protective film. The thickness of the conductive layer which is formed later can be adjusted by the thickness of the resist 1090. In this embodiment, the resist 1090 is provided only on the upper surface (a surface at the side where the conductive members to be formed) of the supporting substrate 1070, but the resist 1090 may also be provided on the lower surface (a surface at the opposite side). With this arrangement, the conductive member can be prevented from being formed at the lower surface side of the supporting substrate at the time of plating described later.

In a case where the protective film (resist) is formed by using photolithography, the protective film (resist) may either be of positive type or negative type. In this embodiment, a method using a positive type resist is described, but a positive type and a negative type can also be used in combination. Other methods can also be used, such as forming a resist by way of screen printing or attaching a sheet-shaped resist.

After the resist which has been applied, a mask 1100 provided with openings is arranged directly or indirectly on the resist and ultraviolet light is irradiated as shown by the arrows in FIG. 1C(a) to carry out exposure. The wavelength of the ultraviolet light used in this step can be selected according to the sensitivity or the like of the resist 1090. Thereafter, a treatment with an etchant is carried out to form the protective film 1090 defining the openings K as shown in FIG. 1C(b). If needed, an acid activation treatment or the like can be performed at this stage.

Further, after forming the metallic layer or the resist, a heating is preferably carried out at a temperature higher than that in the third step described later. The heating is preferably carried out before forming the resist. The heating temperature is preferably in a range of 340 to 500° C., further preferably of 380 to 420° C. With this, an alloy can be formed between the metallic layer and the supporting substrate, or adhesion between the metallic layer and the supporting substrate can be improved. As a result, an adhesion stronger than that between the conductive members and the metallic layer can be obtained, which facilitate separation between the conductive members and the metallic layer at the time of removing the supporting substrate. Thus, light emitting devices can be obtained with good yield.

Next, a first layer having gold (Au) as its main component and a second layer having a metal element other than Au as its main component on the first layer are formed by plating. Thus, as shown in FIG. 1C(c), the conductive member 1010 is formed through the openings K of the protective film 1090. At this time, the plating can be provided with a thickness larger than the thickness of the resist 1090 by adjusting the conditions used in the plating operation. Thus, the conductive member can also be formed on a part of the protective film to obtain a conductive member having protrusions on its side surfaces as shown in FIG. 1A.

The method of plating can be selected appropriately according to the metal to be used, or according to the desired thickness and flatness, and a method such as electrolytic plating or non electrolytic plating can be employed. Electrolytic plating is particularly preferably employed, which facilitates removing of the resist (protective film) and formation of the conductive member with sufficiently uniform shape. Further, in order to improve the adhesion with the top layer (for example Ag), the second layer formed under the top layer is preferably constructed of two layers, a Ni (or Cu) layer and a layer such as Au which is further disposed on the layer by way of strike plating.

After the plating operation, the protective film 1090 is removed by washing, thus the conductive member is formed at a plurality of positions spaced apart from each other, as shown in FIG. 1C(d).

2. Second Step

Figure 1D:
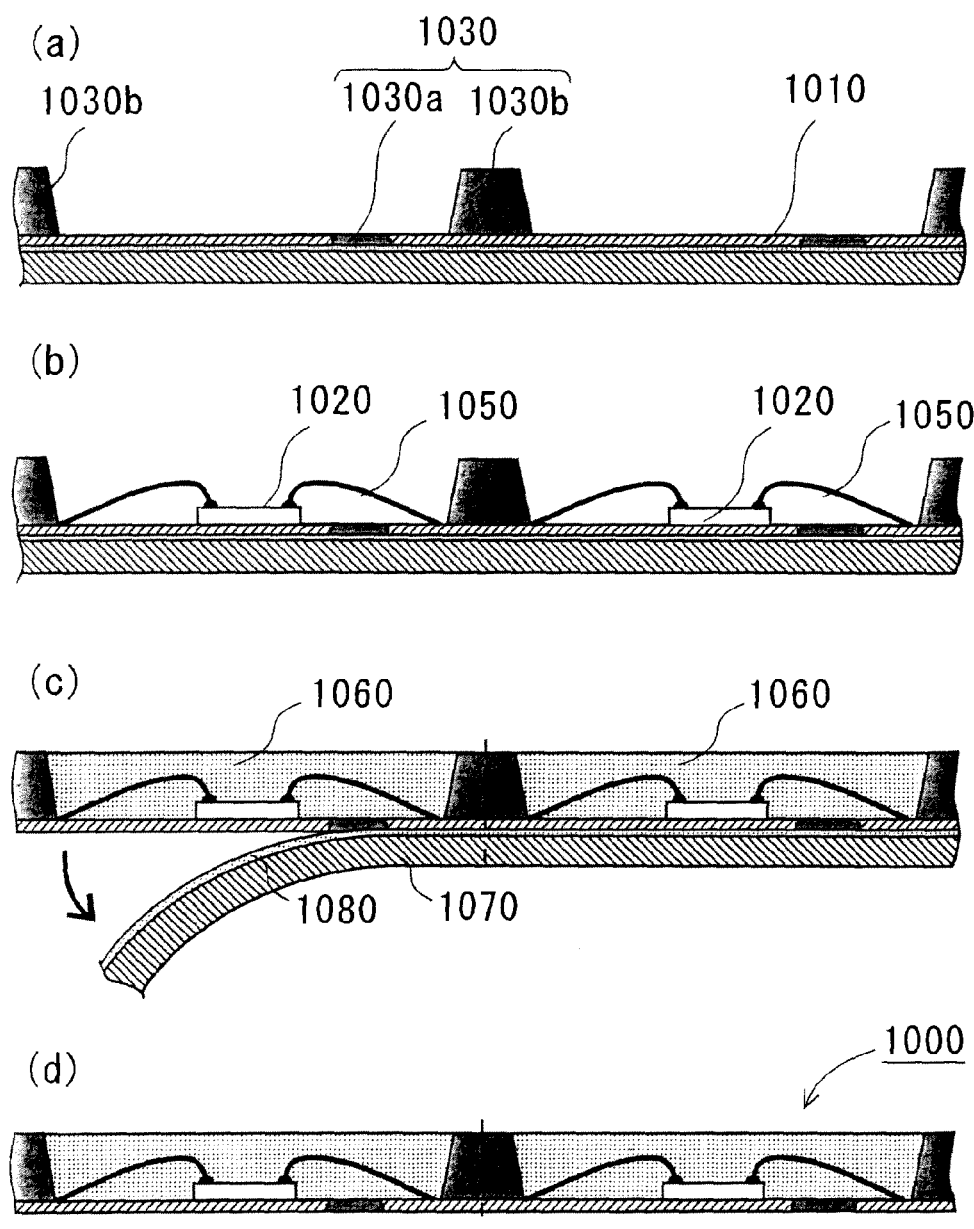
FIG. 1D(a) through FIG. 1D(d) are process diagrams illustrating a method of manufacturing a light emitting device according to an embodiment of the present invention.

Next, as shown in FIG. 1D(a), a base member 1030 is formed which is made of a light-blocking resin capable of reflecting light from the light emitting element. In this embodiment, the bottom surface portions 1030a of the base member and the side walls 1030b of the base member are formed simultaneously between the conductive members 1010. But the bottom surface portions 1030a of the base member and the side walls 1030b of the base member may be formed in different steps, and in such a case, the same light-blocking resin is preferably used, but different light-blocking resin may be used according to the aim and application.

The base member can be formed by way of injection molding, transfer molding, compression molding, or the like. For example, in a case where the base member 1030 is formed by way of transfer molding, a supporting substrate having a plurality of conductive members disposed on it is positioned in a metallic mold so as to be held between the upper portion and the lower portion of the mold. At this time, the supporting substrate may be positioned in the metallic mold via a release sheet or the like. Resin pellets, which are a raw material of the base member, have been inserted in the metallic mold, and the supporting substrate and the resin pellets are heated. After the resin pellets are melted, pressure is applied to fill the metallic mold with the resin. The heating temperature, the heating time, the pressure and the like are appropriately adjusted according to the composition or the like of the resin. After curing the resin, the molded product shown in FIG. 1D(a) is taken out from the metallic mold.

3. Third Step

Next, as shown in FIG. 1D(b), each light emitting element 1020 is bonded on a respective conductive member 1010 surrounded by the side walls 1030b by using an adhesive member (not shown) containing a metal, and each electrode of each light emitting element is connected to a respective conductive member 1010 by using a conductive wire 1050. In this embodiment, a light emitting element having the positive and negative electrode on the same surface side is employed, but a light emitting element having the positive and negative electrode disposed on different surfaces can also be employed.

Next, heat is applied at a temperature lower than the melting point of the metallic layer to melt the adhesive member so that each light emitting element 1020 and respective conductive member 1010 are strongly bonded with each other. The heating temperature depends on the materials of the metallic layer and the adhesive member, but a range of about 200 to 380° C. is preferable, and a range of 270 to 340° C. is further preferable. For example, an Au/Sn 80/20 eutectic solder material has a eutectic temperature in a range of 280 to 320° C. Therefore, heating is preferably carried out within this temperature range. The temperature applied in this step is the highest in the heating steps after forming the metallic layer in the first step. In this temperature range, the diffusion coefficient between Au and a metal (Fe, Ni, Cr etc.) in the stainless steel is large, providing favorable conditions for diffusion of Fe, Ni, Cr etc. into Au, in particular. This temperature is higher than the heating temperature of the adhesive member made solely of resin. Even in a case where heating is carried out at such a high temperature, generation of an alloy layer can be prevented in the metallic layer interposed between the supporting substrate made of the stainless steel and the first layer (Au) which is the bottom layer of the conductive member.

4. Forth Step

In the fourth step, as shown in FIG. 1C(c), a sealing member 1060 made of an optically transmissive resin is disposed in the recesses each defined by the side walls 1030b of the base member, by way of transfer molding, potting, printing, or the like. In a case where a recess is provided in the base member, the optically transmissive resin is preferably disposed in the recess by way of potting. In this manner, the light emitting elements 1020 and the conductive wires 1050 are covered with the sealing member 1060. In this embodiment, the sealing member 1060 is provided to approximately the same height as the side walls 1030b, but it is not limited to this, the sealing member 1060 may be disposed either lower or higher than the side walls 1030b. Also, the upper surface can be either flat as described above or curved with its center depressed or protruded. The sealing member may either have a single layer structure or a multilayer structure made of two or more layers having different compositions and/or properties.

5. Forth Step In the fifth step, after curing the sealing member 1060, the supporting substrate 1070 is detached as shown in FIG. 1D(c) along the interface between the metallic layer 1080 and the first layer of the conductive member 1010. That is, the supporting substrate 1070 is removed with the metallic layer 1080 disposed on its surface.

Through the steps described above, a group 1000 of the light emitting devices such as shown in FIG. 1D(d) can be obtained. Finally, the base member 1030 and the conductive member 1010 are cut together along the dotted line shown in FIG. 1D(d), that is, at a position to cut the side wall 1030b of the base member, to obtain individual light emitting devices 100 as shown in FIG. 1A. Various methods can be employed for separating the individual devices, such as a dicing method using a blade and a dicing method using a laser beam.

In this embodiment, the cutting is carried out at a position so that the side wall 1030b is cut but the sealing member 1060 is not cut, thus, the direction of extracting light can be limited in the upward direction with respect to the light emitting device 100. Accordingly, extracting light in upward direction can be efficiently performed. In FIG. 1D(d), cutting is carried out at a position including the conductive member, but it is not limited to, cutting may be carried out at a position spaced away from the conductive member. In a case where the cutting carried out at a position including the conductive member, the conductive member is also exposed at the side surface of the light emitting device, which facilitates adhesion of a solder and the like. In a case where the cutting is carried out at a position spaced apart from the conductive member, only a portions made of resins are cut, so that the cutting can be carried out more easily than a case where the conductive member and the resins are cut together.

Embodiment 2

Figure 2A:
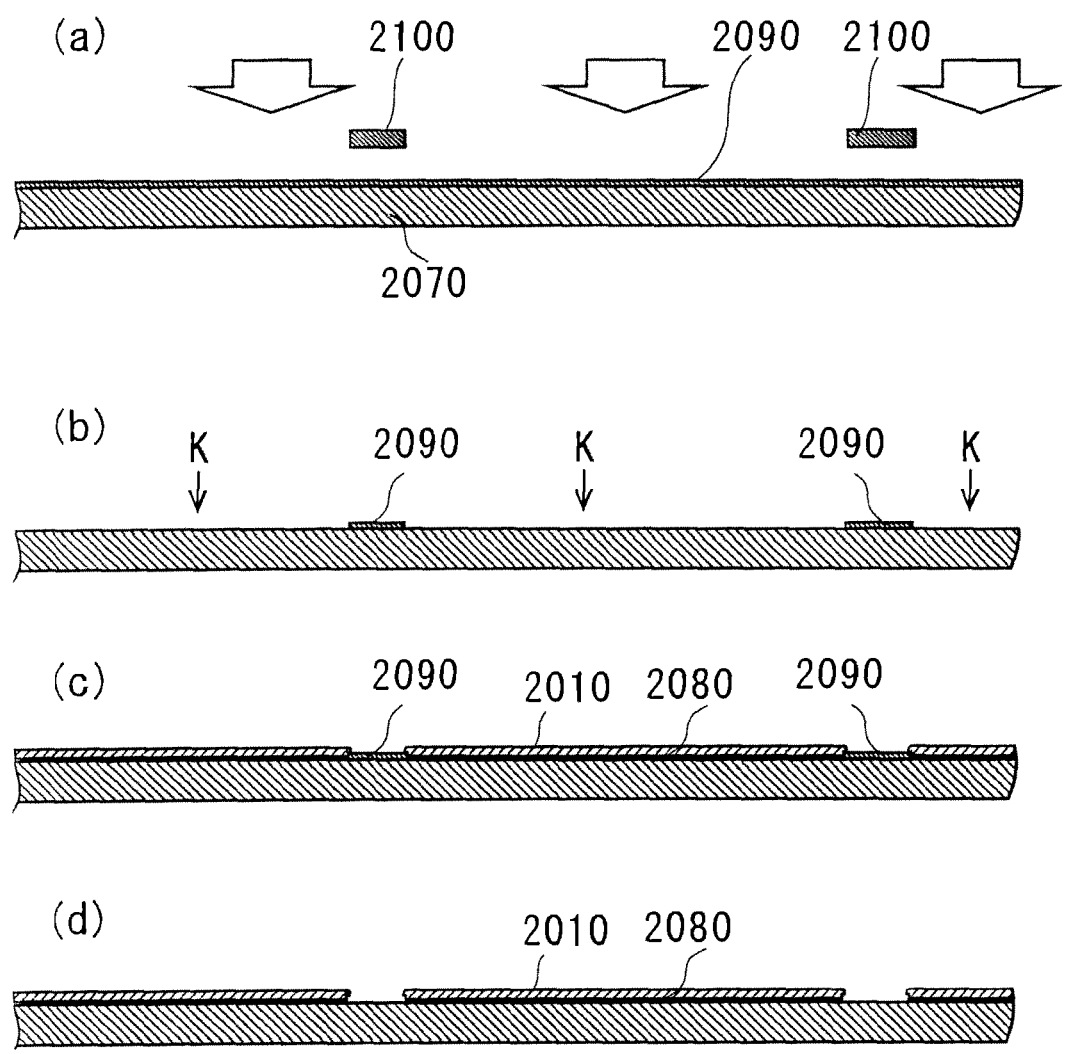
FIG. 2A(a) through FIG. 2A(d) are process diagrams illustrating a method of manufacturing a light emitting device according to an embodiment of the present invention.
Figure 2B:
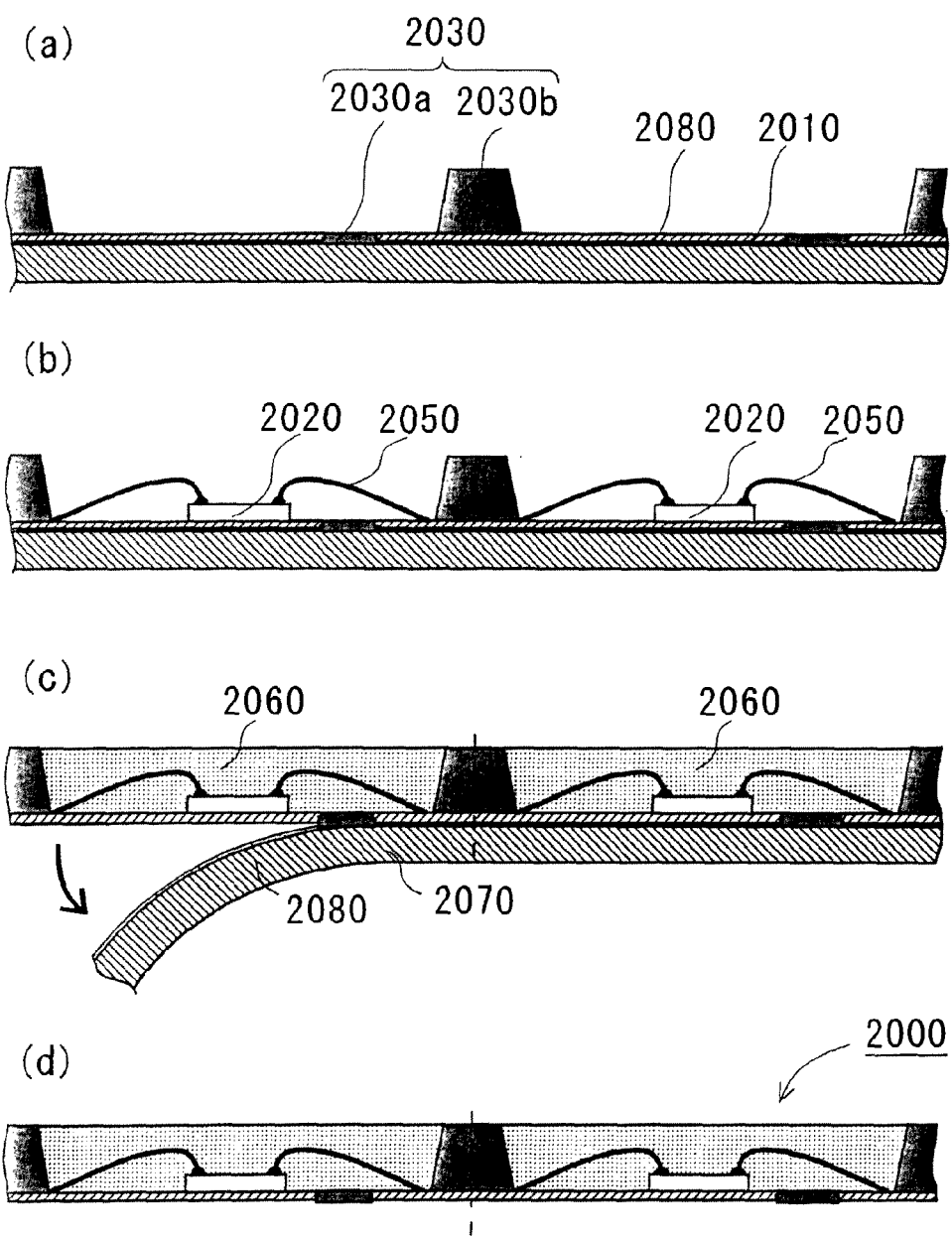
FIG. 2B(a) through FIG. 2B(d) are process diagrams illustrating a method of manufacturing a light emitting device according to an embodiment of the present invention.
Figure 2C:
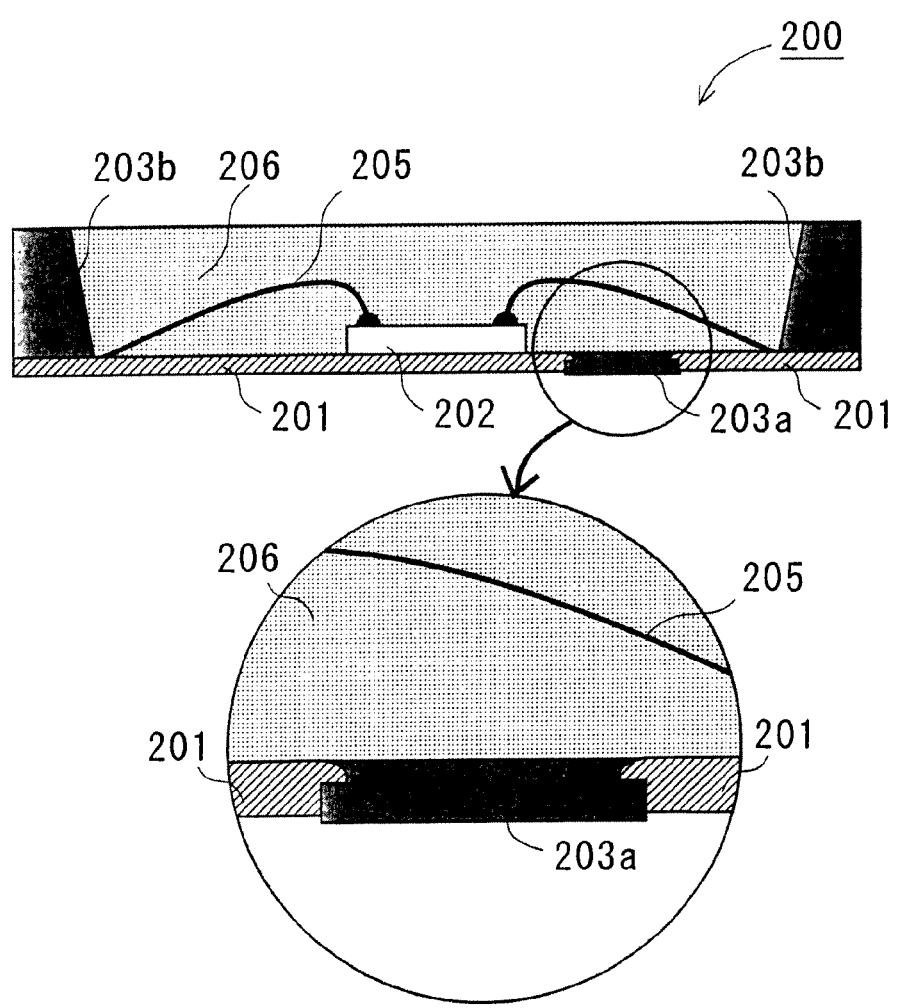
FIG. 2C is a cross sectional view and a partially enlarged view of a light emitting device according to an embodiment of the present invention.

A light emitting device 200 and a method of manufacturing it according to the present embodiment is shown in FIGS. 2A to 2C. FIG. 2C is a cross sectional view and a partially enlarged view of the light emitting device 200.

In the present embodiment, the light emitting device 200 has approximately the same appearance as the light emitting device shown in FIG. 1A, and includes a light emitting element 202, a pair of conductive members 201 each having an upper surface electrically connected to the light emitting element 202, and a base member 203 which is in contact with and holds the periphery of the conductive member 201. The base member 203 is provided with a recess defined by a bottom surface portion 203a and a side wall 203b. and a part of an upper surface of the pair of conductive members 201 are exposed at the bottom surface defining the recess. The lower surface of each conductive member 201 is exposed from the lower surface (back surface) of the base member 203. The light emitting element 202 and each conductive member 101 are respectively electrically connected by a conductive wire 205 and a sealing member 206 is provided in the recess to cover these electric constituent components. In Embodiment 2 of the invention, the lower surface of the base member 203 further protrudes downward than the lower surface of the conductive member 201. With this construction, occurrence of short circuit at the time of mounting a printed circuit board or the like on a mounding substrate can be suppressed.

The light emitting device 200 as described above can be obtained by using a method described below. FIGS. 2A(a) through 2A(d) and FIGS. 2B(a) through 2B(d) are process diagrams each illustrating a step of forming a group 2000 of light emitting devices. The group 2000 of the light emitting devices is cut to obtain individual light emitting devices 200 as shown in FIG. 2C. In the method of manufacturing according to Embodiment 2. the sequence of steps in forming the metallic layer and the protective film on the supporting substrate is in reverse order to that in Embodiment 1. That is, in Embodiment 2. the metallic layer is formed after forming the protective film. Hereinafter, the steps that are different from that of Embodiment 1 will be described. Similar steps as in Embodiment 1 can be employed in other steps and therefore description thereof will be appropriately omitted.

1. First Step

Firstly, as shown in FIG. 2A(a), a planar supporting substrate 2070 made of a stainless steel is prepared. A resist 2090 is applied on the surface of the supporting substrate as a protective film. After drying the resist 2070 that was applied, a mask 2100 provided with openings is arranged directly or indirectly on the resist and ultraviolet light is irradiated as shown by the arrows in FIG. 1E(a) to carry out exposure. Thereafter, a treatment with an etchant is carried out to form the protective film 2090 defining the openings K as shown in FIG. 2A(b).

Next, a metallic layer 2080 containing a metal having a diffusion coefficient with respect to Au smaller than a diffusion coefficient of a metal in the supporting substrate with respect to Au is formed on the supporting substrate exposed in the opening K of the protective film 2090. Then, as in the same manner in Embodiment 1. the heating is carried out preferably at a temperature higher than that in step 3.

Next, by way of plating, a first layer having gold (Au) as its main component is formed on the metallic layer 2080, and a second layer having a metal element other than Au as its main component is formed on the first layer. Thus, as shown in FIG. 2A(c), the metallic layer 2080 and the conductive member 2010 on the metallic layer 2080 are formed in the openings K of the protective film 2090. As described above, the second embodiment is different from the first embodiment in that the metallic layer 2080 is formed in the same shape as the conductive member 2010. In this embodiment, the metallic layer 2080 is preferably formed extremely thinner than the conductive member 2010. The metallic layer 2080 is to be removed with the supporting substrate in the final step, so that if the metallic layer 2080 is formed too thick, the removal will be impeded, and if the difference in height between the back surface of the conductive member and the back surface of the base member is too large, occurrence of defects will increase at the time of mounting to a circuit board or the like. Therefore, preferably, the metallic layer 2080 is formed thin, for example about 0.02 μm to 3 μm, further preferably about 0.02 μm to 1 μm.

After the plating operation, the protective film 2090 is removed by washing, thus the metallic layers 2080 and the conductive members 2010 are formed at a plurality of locations which are spaced apart from each other, as shown in FIG. 2A(d).

2. Second Step

Next, as shown in FIG. 2B(a), a base member 2030 which is made of a light-blocking resin capable of reflecting light from the light emitting element, and which includes a bottom surface portion 2030a and a side wall 2030b, is formed.

3. Third Step

Next, as shown in FIG. 2B(b), each light emitting element 2020 is bonded on a respective conductive member 2010 surrounded by the side walls 2030b, by using an adhesive member (not shown) containing a metal, and each electrode of each light emitting element is connected to a respective conductive member 2010 by using a conductive wire 2050.

Next, heat is applied at a temperature lower than the melting point of the metallic layer to melt the adhesive member so that each light emitting element 2020 and respective conductive member 2010 are strongly bonded with each other.

4. Forth Step

In the fourth step, as shown in FIG. 2B(c), a sealing member 2060 made of an optically transmissive resin is disposed in the recesses each defined by the side walls 2030b of the base member.

5. Fifth Step

In the fifth step, after curing the sealing member 2060, the supporting substrate 2070 is detached as shown in FIG. 2B(c) along the interface between the metallic layer 2080 and the first layer of the conductive member 2010. In the present embodiment, the metallic layer 2080 is formed not on the entire upper surface of the supporting substrate 2070 but formed in plural spaced apart from each other, as in the same manner as the conductive member 2060. Therefore, removal is performed so that the plurality of metallic layers 2080 remain on the upper surface of the supporting substrate 2070 after removing.

Through the steps described above, a group 2000 of the light emitting devices such as shown in FIG. 2B(d) can be obtained. Finally, the base member 2030 and the conductive member 2010 are cut together along the dotted line shown in FIG. 2B(d), that is, at a position to cut the side wall 2030b of the base member, in order to obtain individual light emitting devices 200 shown in FIG. 2C, in which the bottom surface of the base member (bottom surface portion) 203 protruding further than the lower surface of the conductive member 201a. In FIG. 2C, a structure in which the bottom surface of bottom surface portion 203a of the base member protrudes further than the lower surface of the conductive member 201 is exemplified. But another structure, in which the lower surface of the side wall 203b of the base member also protrudes further than the lower surface of the conductive member 201 can also be employed, which allows mounting in a balanced manner, and thus is preferable.

Embodiment 3

Figure 3A:
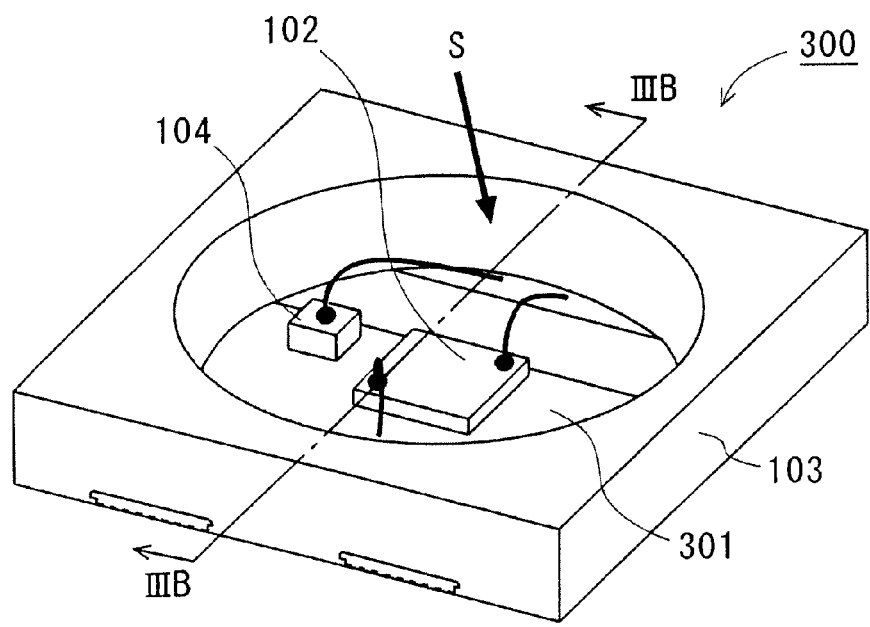
FIG. 3A is a perspective view showing a whole structure and inner structure of a light emitting device according to an embodiment of the present invention.
Figure 3B:
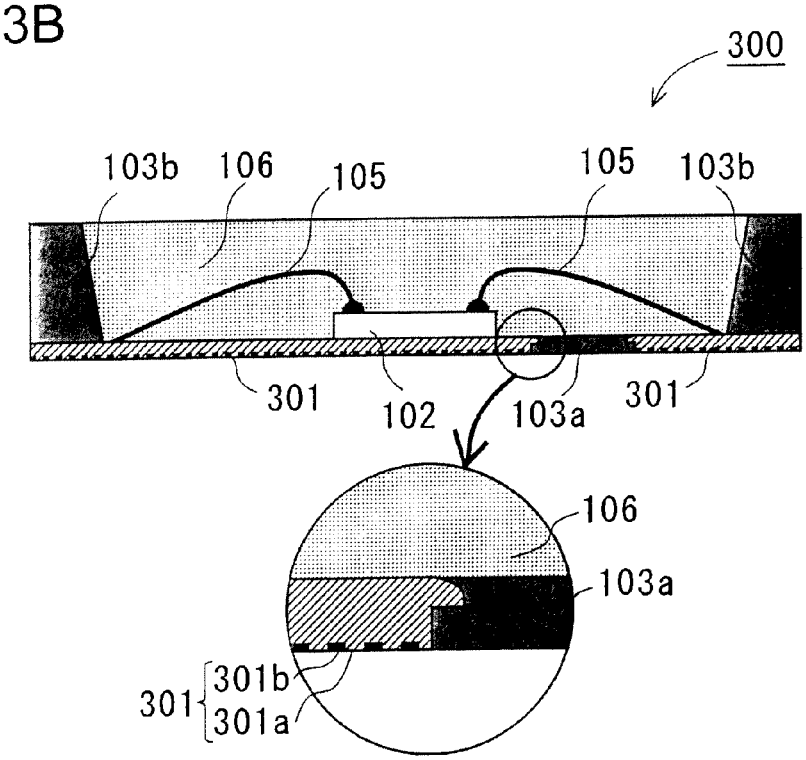
FIG. 3B is a cross sectional view of the light emitting device of FIG. 3A taken along the line IIIB-IIIB.
Figure 3C:
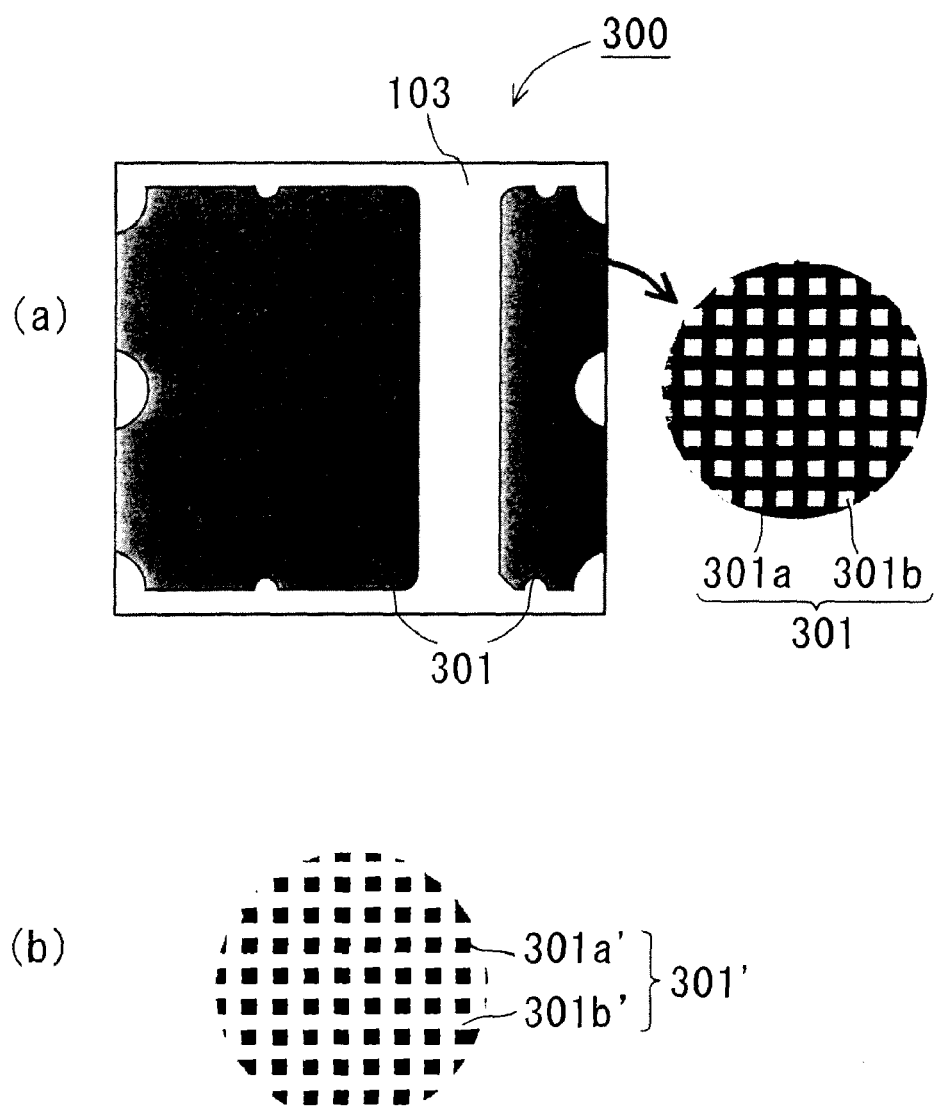
FIG. 3C is a bottom plan view and a partially enlarged view of a light emitting device of FIG. 3A.

A light emitting device 300 of the present embodiment is shown in FIG. 3A to FIG. 3O. FIG. 3A is a perspective view of the light emitting device 300, FIG. 3B is a cross-sectional view of the light emitting device 300 shown in FIG. 3A taken along the line IIIB-IIIB, and FIG. 3C is a bottom plan view and a partially enlarged view of a light emitting device 300 shown in FIG. 3A.

In Embodiment 3. the light emitting device 300 includes, as in the same manner in Embodiment 1. a light emitting element 102, a pair of conductive members 101 each having an upper surface electrically connected to the light emitting element 102, and a base member 103 which is in contact with and holds the periphery of the conductive member 301. The base member 103 is made of a resin to which various filling materials having light blocking properties are added to block light from the light emitting element 102, and provided with a recess S defined by a bottom surface portion 103*a* and a side surface 103*b*. A part of the upper surface of each of a pair of conductive members 301 is exposed at the bottom surface of the recess S. The lower surface of each conductive member 301 is exposed from the lower surface (back surface) of the base member 103. The light emitting element 102 and each conductive member 301 are respectively electrically connected by a conductive wire 105 and a sealing member 106 is provided in the recess S to cover these electric constituent components. Moreover, in Embodiment 3. the lower surface of each conductive member 301 has a first region 301*a* containing Au and a second region containing a metallic member having a diffusion coefficient with respect to a metal in the stainless steel smaller than a diffusion coefficient of Au with respect to the metal contained in the stainless steel.

Figure 3D:
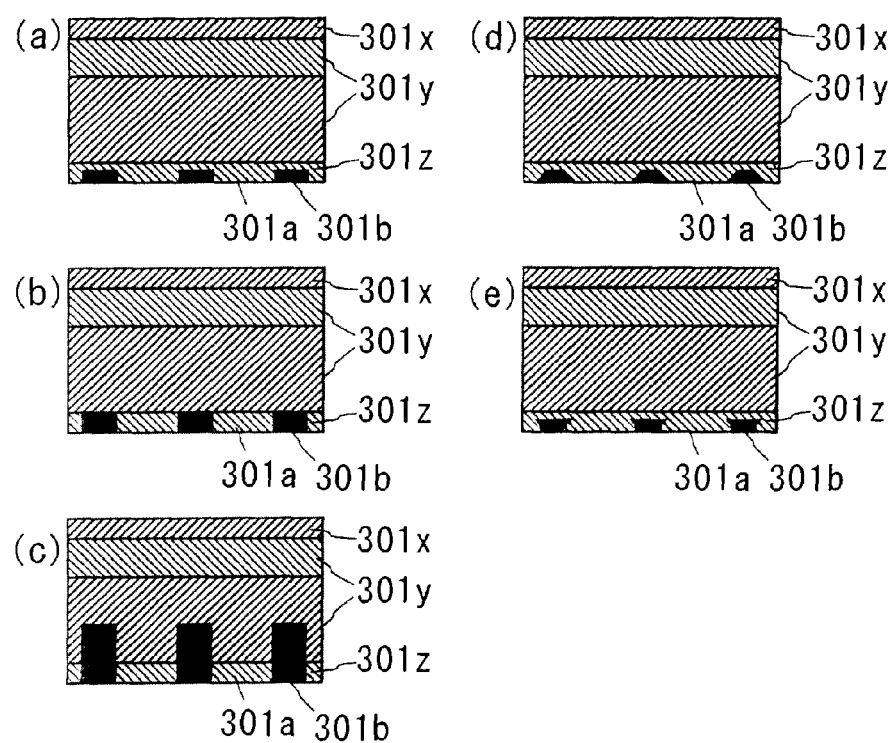
FIG. 3D(a) to FIG. 3D(e) each shows a partially enlarged view of a light emitting device according to an embodiment of the present invention.
Figure 3E:
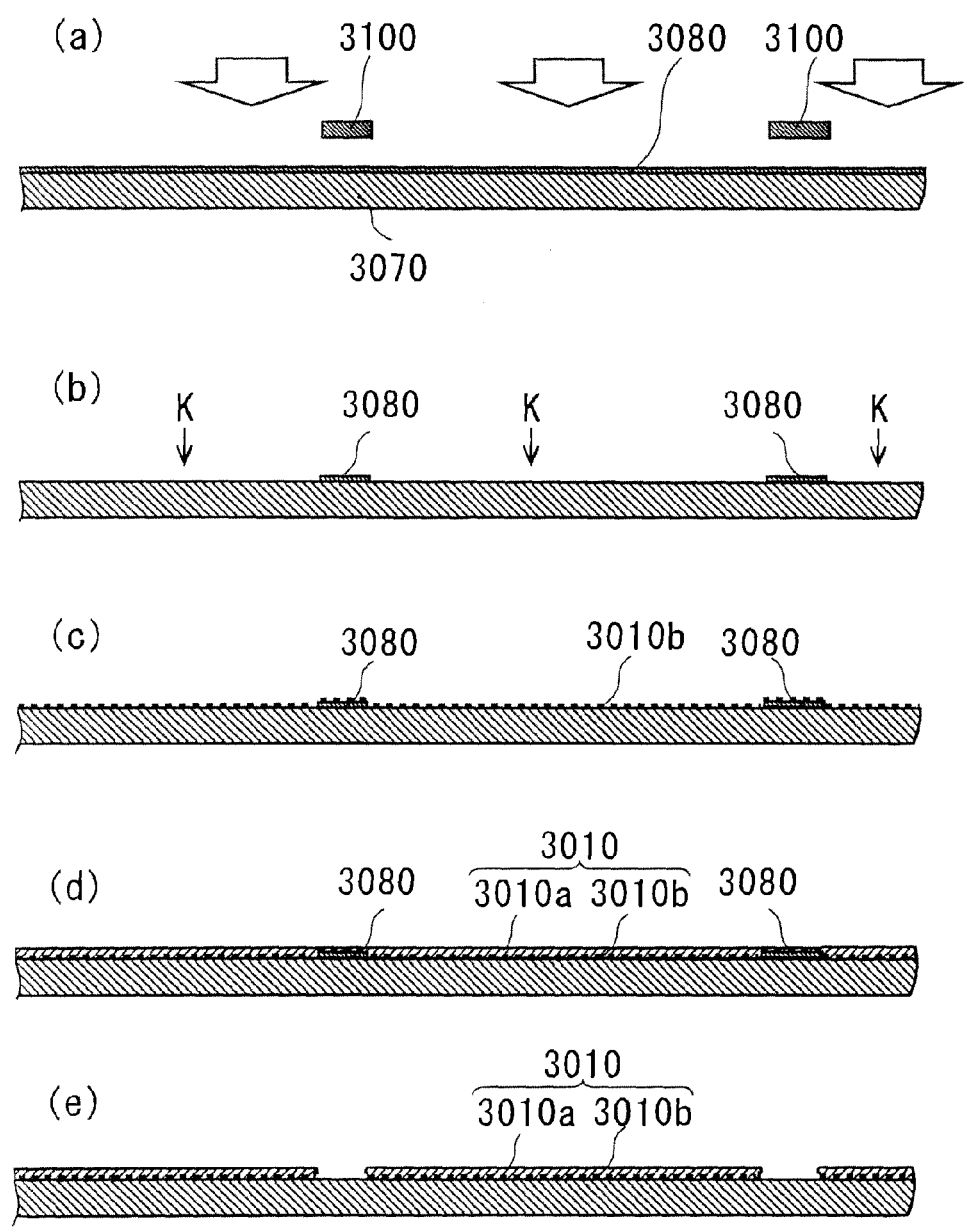
FIG. 3E(a) through FIG. 3e(e) are process diagrams illustrating a method of manufacturing a light emitting device according to an embodiment of the present invention.

The light emitting device 300 as described above can be obtained by using a method described below. FIGS. 3E(a) through 3E(e) and FIGS. 3F(a) through 3F(d) are process drawings each showing a method of manufacturing a group 3000 of light emitting devices, and each individual light emitting device 300 as shown in FIG. 3A can be obtained by breaking the group 3000.

1. First Step

Firstly, as shown in FIG. 3E(a), a planar supporting substrate 3070 made of a stainless steel is prepared. A resist 3080 is applied on the upper surface of the supporting substrate as a protective film. The thickness of the conductive member which is formed later can be adjusted by the thickness of the resist 3080. In this embodiment, the resist 3080 is provided only on the upper surface (a surface at the side where the conductive members to be formed) of the supporting substrate 3070, but the resist 3080 may also be provided on the lower surface (a surface at the opposite side). With this arrangement, the conductive member can be prevented from being formed at the lower surface side of the supporting substrate at the time of plating described later.

The protective film (resist) can be formed by using the same method as in Example 1.

After drying the resist which has been applied, a mask 3100 provided with openings is arranged directly or indirectly on the resist and ultraviolet light is irradiated as shown by the arrows in FIG. 1C(a) to carry out exposure. The wavelength of the ultraviolet light used in this step can be selected according to the sensitivity or the like of the resist 3080. Thereafter, a treatment with an etchant is carried out to form the protective film 3080 defining the openings K as shown in FIG. 3E(b). If needed, an acid activation treatment or the like can be performed at this stage.

Next, a metallic member is formed on the supporting substrate exposed in the openings. The metallic member has a diffusion coefficient with respect to the metallic member constituting the second region in the bottom layer (lower surface) of the conductive member, that is a metal in the stainless steel, smaller than a diffusion coefficient of Au with respect to the metal in the stainless steel. In this step, the portion arranged to be the first region is needed to be covered with a protective film, so that a protective film such as resist is formed and openings are defined in the same manner as shown in FIG. 3E(a) and FIG. 3E(b). Then, the metallic member is disposed by way of sputtering, vapor deposition, plating or the like to form the second region 3010*b*.

For example, in FIG. 3E(c), a second region 3010*b* made of a metallic member such as Ti or Pt is formed by using a mask (not shown) provided with a smaller opening than the mask 3100 provided with a relatively large opening used in FIG. 3E(a). The shape of the second region can be selected as in FIG. 3C(a) and FIG. 3C(b), according to the shape defining the openings of the protective film. In FIG. 3E(c), the second region is formed directly on the surface of the supporting substrate 3070 and also on the resist (protective film) 3080 which is formed previously. This formation can be selected by the shape of the mask and the second region can be designed so as not to be formed on the resist 3080. Further, in the case where the side walls defining the openings in the resist are formed with an angle by adjusting the irradiation angle of the ultraviolet light used at the time of curing the resist, the second region 301*b* made of a metallic member can be formed with, for example, a larger surface area at its bottom-surface side as shown in FIG. 3D(d), or a smaller surface area at its bottom-surface side as shown in FIG. 3D(e). With this arrangement, the adhesion with Au constituting the first region which is formed subsequently can be improved.

After forming such second region as described above, the resist (not shown) is removed and the conductive member which will serve as the first region is formed. In this embodiment, as shown in FIG. 3E(d), Au is plated to continuously cover the upper surface of the supporting substrate 3070 and the second region 3010*b* formed on the upper surface of the supporting substrate 3070. In a case where nonelectrolytic plating is employed, Au is also plated on the second region formed on the resist 3080 made of an insulating member. Also in a case where electrolytic plating is employed, if a part of the second region on the resist 3080 and the supporting substrate are connected, Au is plated on the connected portion.

FIGS. 3D(a) to 3D(e) are a partially enlarged view of a conductive member 301. In the case shown in FIG. 3D(a), the metallic member constituting the second region 301*b* is thinner than the bottom layer 301*z* made of Au, and Au is continuously disposed also on the second region 301*b*. In the case shown in FIG. 3D(b), the metallic member constituting the second region 301*b* and Au in the bottom layer 301*z* are formed with approximately the same thickness. In the case shown in FIG. 3D(c), the metallic member constituting the second region 301*b* is thicker than the bottom layer 301*z*. and extends into the intermediate layer 301*y*. As described above, the thickness of the metallic member constituting the second region can be set appropriately, and although not shown in the figures, the metallic member can be extended into all of the plurality of intermediate layers, and further, can be extended into the top layer 301*x* or extended into the upper surface of the top layer. However, in such a case in which the reflectivity is increased by employing the top layer made of high reflectivity material such as Ag, it is preferable that the metallic member is not extended to the upper surface of the top layer. Also, according to the thermoelectric conductivity and other properties of the metallic member constituting the second region, a second region that is too thick may adversely affect heat resistance and/or electrical resistance. Therefore, for example, Ti or the like is preferably employed with approximately the same thickness as that of Au employed as the bottom layer.

The conductive material 3010 formed in the opening portions K can be plated to be thicker than the resist 3080 by adjusting the plating conditions. With this, the conductive member can be formed extended to the upper surface of the protective film, and thus, the conductive member having protrusions on its side surfaces as shown in FIG. 3A can be formed. The method of plating can be selected appropriately according to the metal to be used, or according to the desired thickness and flatness, and a method such as electrolytic plating or non electrolytic plating can be employed. Electrolytic plating is particularly preferably employed, which facilitates removing of the resist (protective film) and formation of the conductive member with sufficiently uniform shape. Moreover, in order to improve the adhesion with the top surface layer (Ag, for example), an intermediate layer (Au, for example) is preferably formed below the top surface layer by way of strike plating.

After the plating operation, the resist 3080 is removed by washing, thus the conductive member is formed at a plurality of positions spaced apart from each other, as shown in FIG. 3E(e). When the resist 3080 is removed, the conductive member formed on the resist 3080 is also removed (lift-off), so that the upper surface of the supporting substrate 3070 is exposed between the plurality of the conductive members 3010.

2. Second Step

Figure 3F:
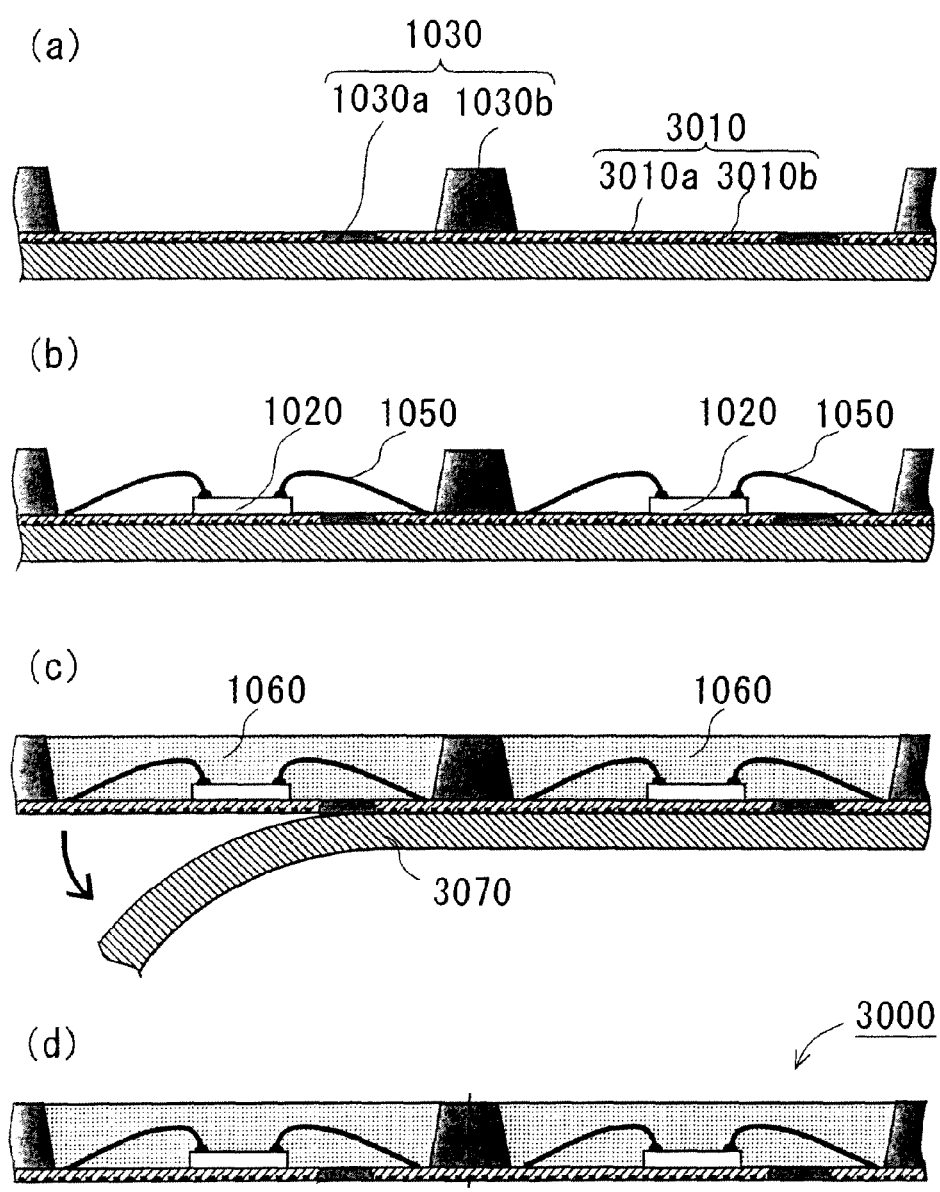
FIG. 3F(a) through FIG. 3F(d) are process diagrams illustrating a method of manufacturing a light emitting device according to an embodiment of the present invention.

Next, as shown in FIG. 3F(a), a base member 1030 made of a light-blocking resin capable of reflecting light from the light emitting element is formed. The base member 1030 can be formed in the same manner as the second step in Embodiment 1.

3. Third Step

Next, as shown in FIG. 3F(b), each light emitting element 1020 is bonded on a respective conductive member 3010 surrounded by the side walls 1030*b* by using an adhesive member (not shown) containing a metal, and each electrode of each light emitting element is connected to a respective conductive member 3010 by using a conductive wire 1050. In this embodiment, a light emitting element having the positive and negative electrode on the same surface side is employed, but a light emitting element having the positive and negative electrode disposed on different surfaces can also be employed.

4. Forth Step

In the fourth step, as shown in FIG. 3F(c), a sealing member 1060 made of a optically transmissive resin is disposed in the recesses each defined by the side walls 1030*b* of the base member, by way of transfer molding, potting, printing, or the like. The base member 1060 can be formed in the same manner as the fourth step in Embodiment 1. The sealing member may either have a single layer structure or a multi-layer structure made of two or more layers.

5. Fifth Step

In the fifth step, after curing the sealing member 1060, the supporting substrate 3070 is detached as shown in FIG. 3F(c) along the interface between the lower surface of the bottom layer of the conductive member 3010 which includes the first region and the second region and the upper surface of the supporting substrate 3070.

Through the steps described above, a group 3000 of the light emitting devices such as shown in FIG. 3F(d) can be obtained. Finally, the base member 1030 and the conductive member 3010 are cut together along the dotted line shown in FIG. 3F(d), that is, at a position to cut the side wall 1030*b* of the base member, to obtain individual light emitting devices 300 as shown in FIG. 3A. The fifth step as in Embodiment 1 can be performed to individually separate the devices.

Embodiment 4

Figure 4A:
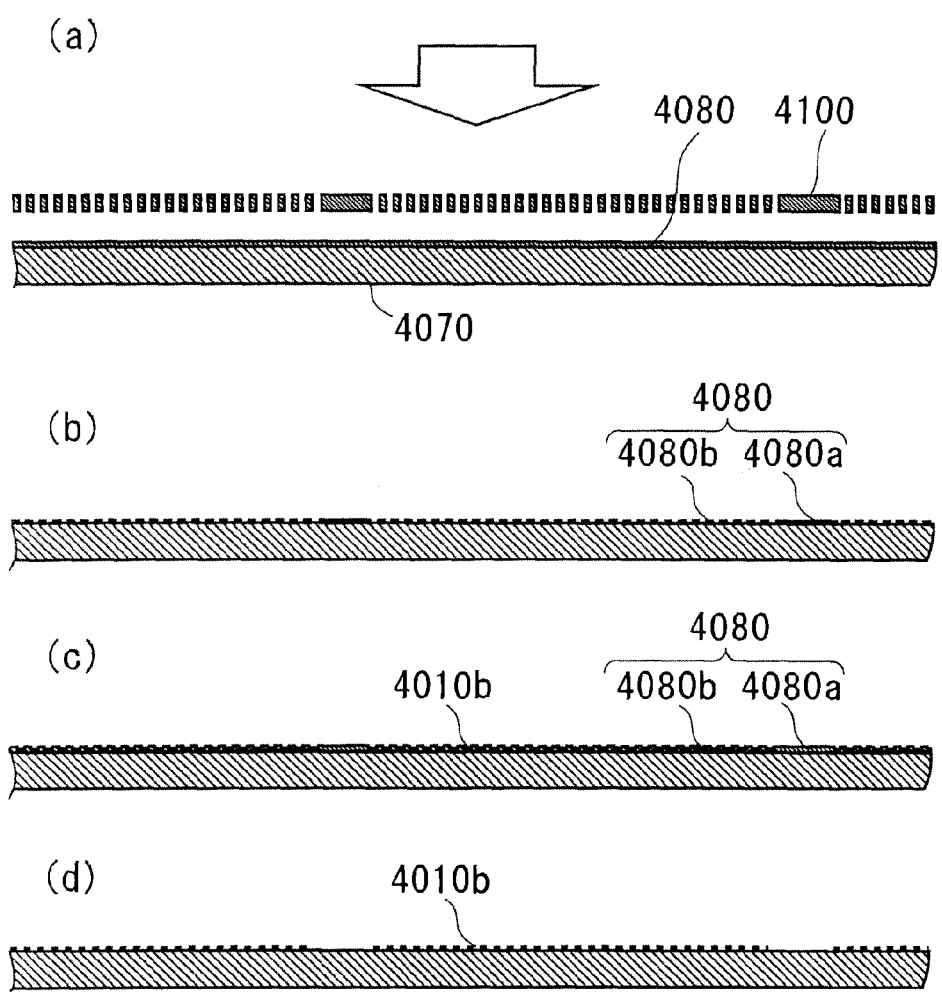
FIG. 4A(a) through FIG. 4A(d) are process diagrams illustrating a method of manufacturing a light emitting device according to an embodiment of the present invention.
Figure 4B:
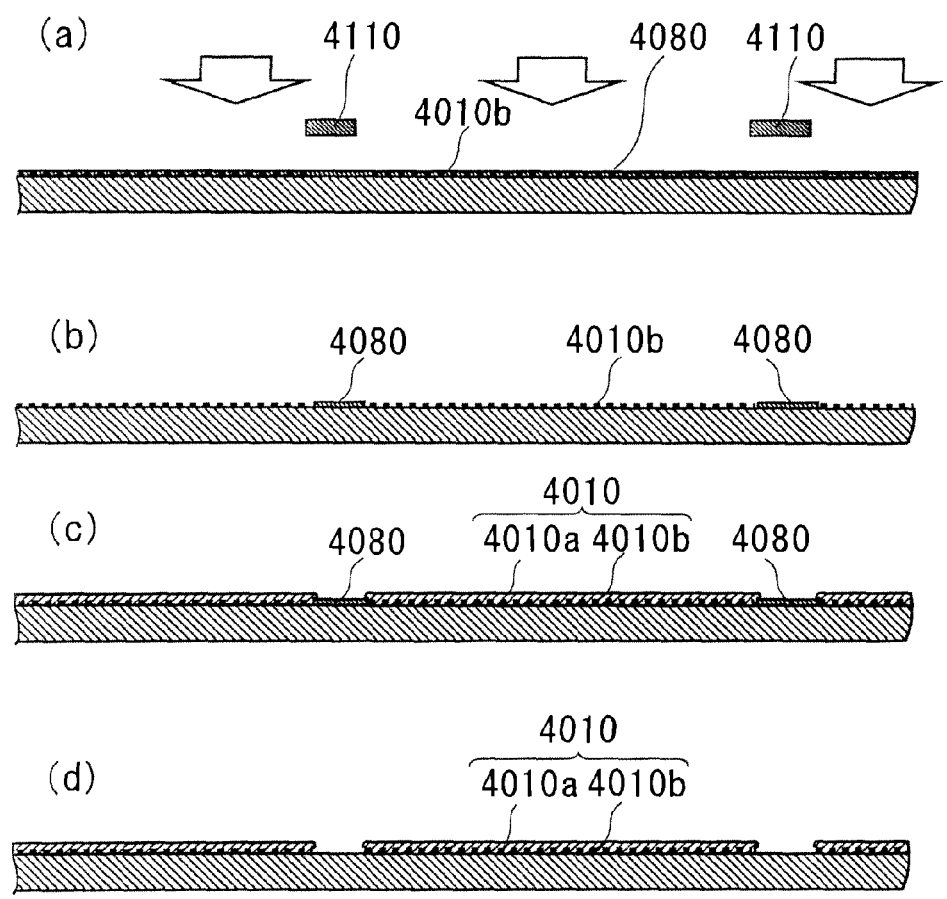
FIG. 4B(a) through FIG. 4B(d) are process diagrams illustrating a method of manufacturing a light emitting device according to an embodiment of the present invention.

A light emitting device 400 and a method of manufacturing it according to the present embodiment is shown in FIGS. 4A and 4B. A manufacturing method according top Embodiment 4 is performed in the same manner as in Embodiment 3. except that in the formation of the metallic member constituting the second region of the conductive member. The aggregate of the light emitting devices and the light emitting device obtained by individually separating the group of the light emitting devices according to Embodiment 4 are similar to that obtained in Embodiment 3. Hereinafter, the steps that are different from that of Embodiment 3 will be described. Similar steps as in Embodiment 3 can be employed in other steps and therefore description thereof will be appropriately omitted.

1. First Step

Firstly, as shown in FIG. 4A(a), a planar supporting substrate 4070 made of a stainless steel is prepared. A resist 4080 is applied on the upper surface of the supporting substrate as a protective film. After drying the resist which has been applied, a mask 4100 provided with openings is arranged directly or indirectly on the resist and exposed to ultraviolet light as shown by the arrows in the figure. In the present embodiment, a mask 4100 provided with smaller openings is used, in order to dispose the metallic member constituting the second region of the conductive member in a later step. Further, in order to prevent a formation of the conductive member in the region to form the base member (particularly the bottom surface portion) in a later step, the shape of musk is adjusted so that the resist is formed in the regions corresponding to the shape of the bottom surface region of the base member.

After the exposure is performed, a treatment with an etchant is carried out to form the resist 4080 defining the openings as shown in FIG. 4A(b). In the present embodiment, according to the size of the openings in the mask, the resist 4080*b* is formed at the portions to be the first region in the lower surface of the conductive member in later step, and the resist 4080*a* is formed at the portions where the base bodies (bottom surface portions) to be formed in later step.

Next, on the substrate 4070 exposed in each opening, a metallic member constituting the second region 4010*b* in the lower surface of the conductive member, that is a metallic member having a diffusion coefficient with respect to a metal in the stainless steel smaller than a diffusion coefficient of Au with respect to the metal in the stainless steel, is formed on the support substrate 4070 exposed in the openings. Thereafter, the resist is removed to form a plurality of metallic members as shown in FIG. 4A(d), which form the second region 4010*b* in the lower surface of the conductive member.

Next, in order to form the conductive member which is to be the first region, once again, the resist 4080 is provided on the entire upper surface of the supporting substrate as shown in FIG. 4B(a), and ultraviolet light is irradiated through the mask 4110 to perform an exposure. In the present embodiment, a mask provided with openings which allow the resist to remain only in the region to form the base member (bottom portion) in later step. Thereafter, a treatment with an etchant is carried out to form a plurality of resists 4080 as shown in FIG. 4B(b) are formed.

Next, as shown in FIG. 4B(c), Au constituting the first region 4010*a* in the lower surface of the conductive member is formed, then, plating is carried out in the same manner as in Embodiment 3 to form the conductive member 4010.

Thereafter, the resist 4080 is removed to form a plurality of conductive materials 4010 as shown in FIG. 4B(d) on the supporting substrate.

The steps after the second step are performed in the same manner as in Embodiment 3 to obtain the light emitting device of Embodiment 4. Although the first step is differently performed, the light emitting device finally obtained is substantially the same as that obtained in Embodiment 3.

Embodiment 5

Figure 5A:
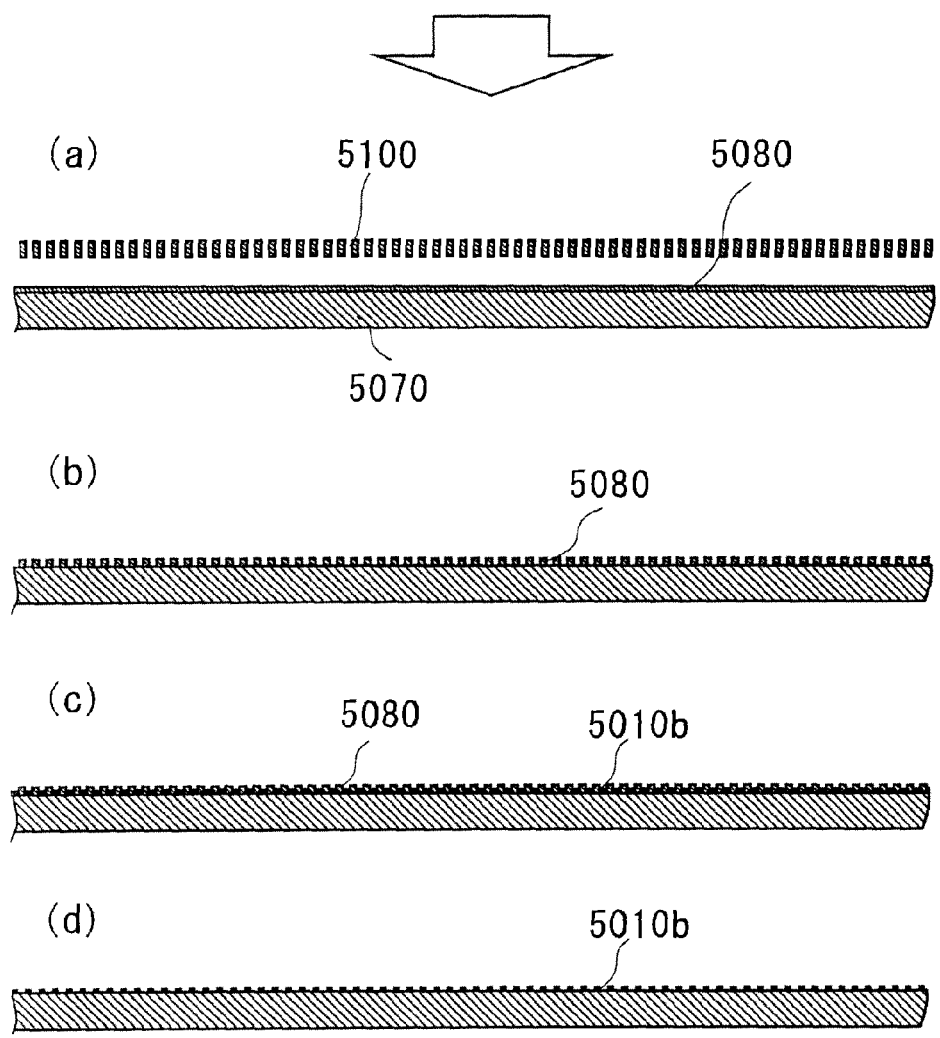
FIG. 5A(a) through FIG. 5A(d) are process diagrams illustrating a method of manufacturing a light emitting device according to an embodiment of the present invention.
Figure 5B:
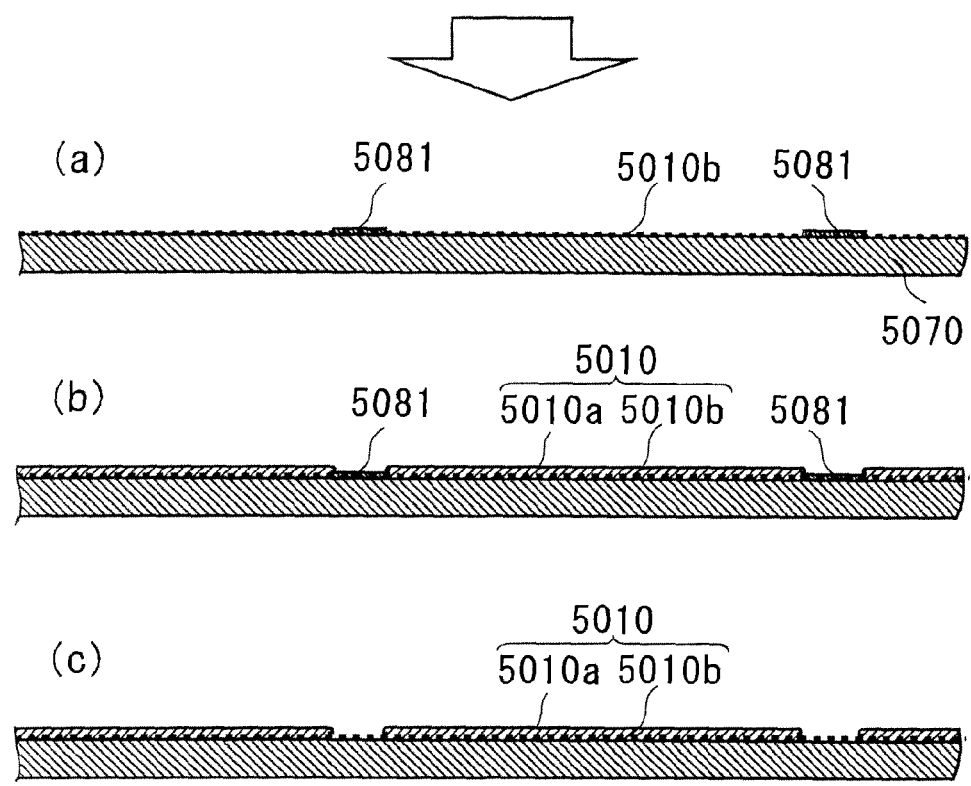
FIG. 5B(a) through FIG. 5B(c) are process diagrams illustrating a method of manufacturing a light emitting device according to an embodiment of the present invention.
Figure 5C:
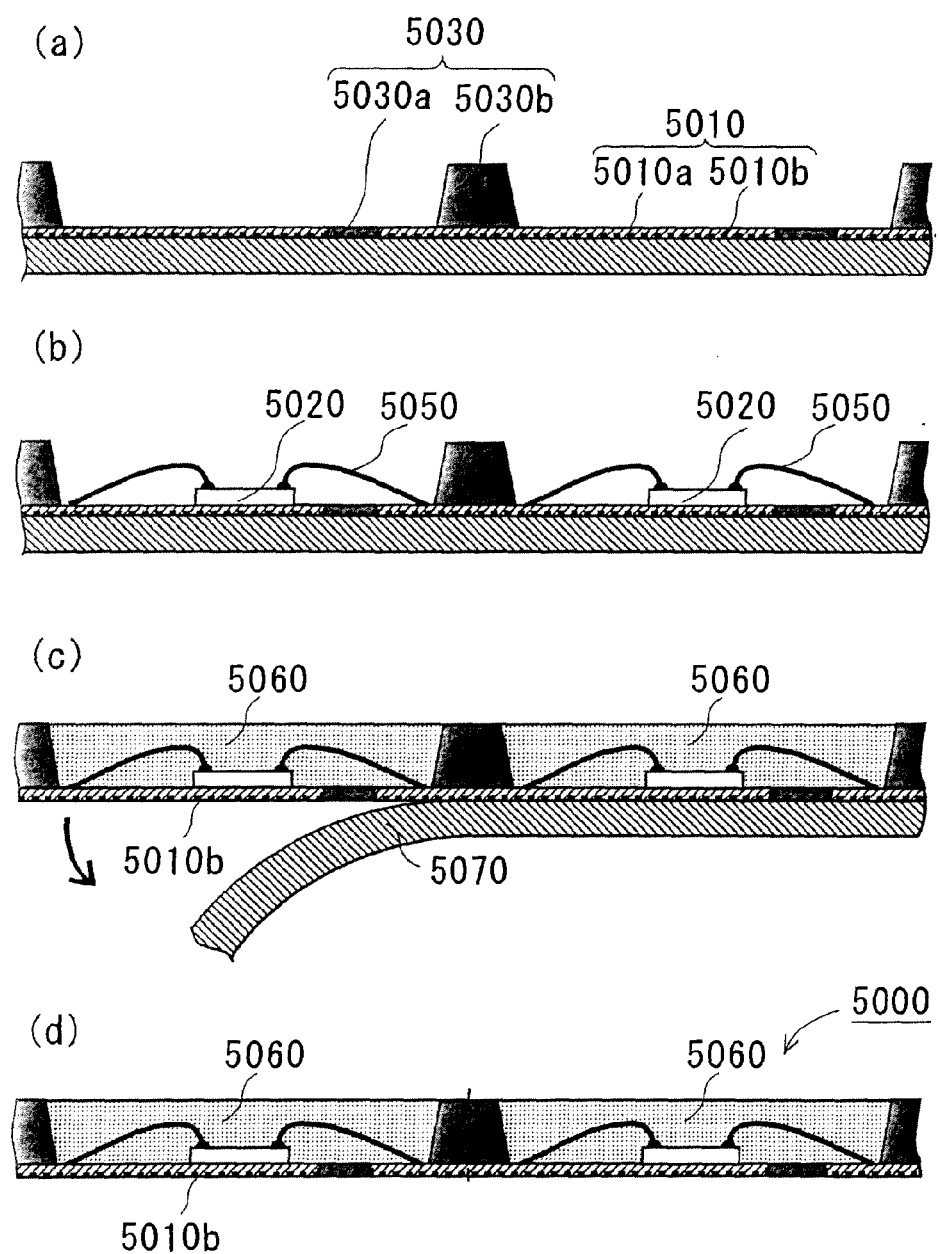
FIG. 5C(a) through FIG. 5C(d) are process diagrams illustrating a method of manufacturing a light emitting device according to an embodiment of the present invention.
Figure 5D:
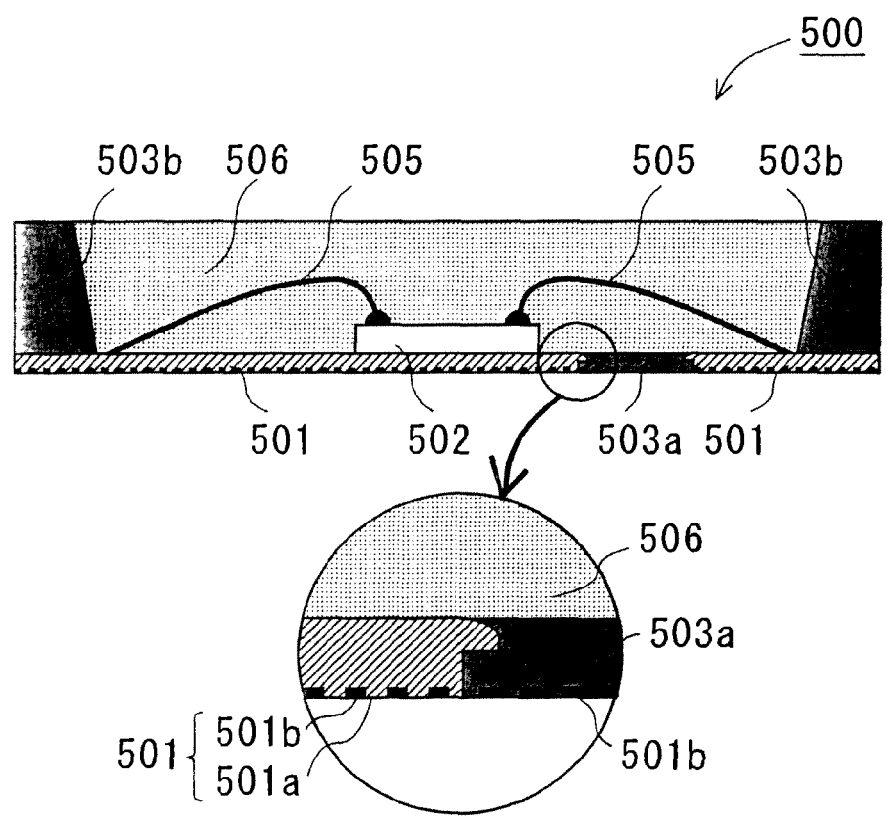
FIG. 5D is a cross sectional view and a partially enlarged view of a light emitting device according to an embodiment of the present invention.

A light emitting device 500 of the present embodiment is shown in FIG. 5D. FIG. 5D is a cross sectional view and a partially enlarged view of the light emitting device 500.

In Embodiment 5. the light emitting device 500 includes a light emitting element 502, a pair of conductive members 501 each having an upper surface electrically connected to the light emitting element 502, and a base member 503 which is in contact with and holds the periphery of the conductive member 501. The base member 503 is provided with a recess defined by a bottom surface portion 503a and a side wall 503b. and a part of an upper surface of the pair of conductive members 501 are exposed at the bottom surface defining the recess. The lower surface of each conductive member 501 is exposed from the lower surface (back surface) of the base member 503. The light emitting element 502 and each conductive member 501 are respectively electrically connected by a conductive wire 505 and a sealing member 506 is provided in the recess to cover these electric constituent components. In Embodiment 5. the lower surface of the conductive member 501 includes a first region 501a made of Au and a second region 501b containing a metallic member having a diffusion coefficient to a metal in the stainless steel smaller than a diffusion coefficient of Au with respect to the metal in the stainless steel, and further, the lower surface of the base member 503 is provided with the metallic member constituting the second region formed in the lower surface of the conductive member.

The light emitting device 500 as described above can be obtained by using a method described below. Embodiment 5 can be carried out substantially in the same manner as in other embodiments except that the positions for the second regions of the conductive member are also provided on the supporting substrate to the portions where the base bodies are formed later. FIG. 5A to FIG. 5C are process drawings each showing a steps of forming a group 5000 of the light emitting devices. Each individual light emitting device 500 as shown in FIG. 5D can be obtained by cutting the group 5000 of the light emitting devices into individual devices.

1. First Step

Firstly, as shown in FIG. 5A(a), a planar supporting substrate 5070 made of a stainless steel is prepared. A resist 5080 is applied on the surface of the supporting substrate as a protective film. After drying the resist 5070 which has been applied, a mask 5100 provided with openings is arranged directly or indirectly on the resist and ultraviolet light is irradiated as shown by the arrows in the figure to carry out exposure. Thereafter, a treatment with an etchant is carried out to form the protective film 5080 defining the openings as shown in FIG. 5A(b). The protective film 5080 is formed to be distributed with approximately uniformly, without differentiating the regions for the conductive member and the regions for the base member which are formed in a later step.

Next, as shown in FIG. 5A(c), a metallic member constituting the second region 5010b in the lower surface of the conductive member, that is a metallic member having a diffusion coefficient with respect to a metal in the stainless steel smaller than a diffusion coefficient of Au with respect to the metal in the stainless steel, is formed on the support substrate 5070 exposed in the openings. Thereafter, the resist is removed to form a plurality of metallic members as shown in FIG. 5A(d), which form the second regions 5010b in the lower surface of the conductive member.

Next, in order to form the conductive member which will serve as the first region, once again, the resist 5081 is disposed on the upper surface of the supporting substrate 5070, as shown in FIG. 5B(a). At this time the resist 5081 is only disposed on the regions where the base bodies (bottom portions) will be formed later.

Next, as shown in FIG. 5B(c), Au constituting the first region 5010a in the lower surface of the conductive member is formed, then, plating is carried out in the same manner as in Embodiment 3 to form the conductive member 5010.

Thereafter, the resist 5080 is removed to form a plurality of conductive materials 5010 as shown in FIG. 5B(d) on the supporting substrate. At this time, the metallic member 5010b constituting the second region of the conductive member 5010 includes those covered with the first region 5010a and those exposed uncovered with the first region 5010a.

2. Second Step

The steps after the second step are carried out in the same manner as in Embodiment 3. As shown in FIG. 5C(a), a base member 5030 having a bottom surface portion 5030a and a side wall 5030b is formed. At this time, the base member 5030 is formed so that the metallic member constituting the second region 5010b of the conductive member 5010 is embedded in the base member 5030. Next, as shown in FIG. 5C(b), the light emitting element 5020 is mounted and each electrode of the light emitting element is connected to the corresponding conductive member 5010 by using a conductive wire 5050. Thereafter, as shown in FIG. 5C(c), the sealing member 5060 is formed to cover the light emitting element 5020, the supporting substrate 5070 is removed to form the group 5000 of the light emitting devices, and the group 5000 of the light emitting devices is cut along the dotted line shown in FIG. 5C(d) to separate individual devices. Thus, the light emitting device 500 shown in FIG. 5D is obtained.

As shown in FIG. 5D, the metallic member 501b constituting the second region of the conductive member is embedded in the lower surface side of the base member 503. The metallic member 501b disposed at such a position does not contribute to electrical conduction, so that it does not function as an electrode. However, such a metallic member 501b can serve as a heat dissipation member which facilitates releasing of heat generated in the light emitting element 502 to outside through the base member 503, so that heat-resistant properties of the device can be improved.

Hereinafter, each members of the light emitting device of the embodiments will be described in detail.

(Supporting Substrate)

A supporting member is a planar or a sheet-shaped member used to form a conductive member and is removed before separating individual devices. Therefore, the supporting member is not included in a finished light emitting device.

The supporting substrate is made of a stainless steel (SUS) and various stainless steels such as martensitic, ferritic, austenitic stainless steels can be employed. Ferritic stainless steels, particularly of the 400-series and the 300-series are preferable. Further, SUS460 ($10.4 \times 10^{-6}$/K), SUS444 ($10.6 \times 10^{-6}$/K), SUS303 ($18.7 \times 10^{-6}$/K), SUS304 ($17.3 \times 10^{-6}$/K), and the like, are suitably employed. In a case where acid treatment is performed as a pre-treatment of the plating, the surface of 400-series stainless steels tend to become rougher than that of 300-series stainless steels. Accordingly, the surface of a plated layer formed on the surface of an acid-treated 400-series stainless steel also tends to become rough. With this, adhesion with a sealing member and a resin constituting the base member can be improved. Whereas, the surface of 300-series stainless steels tends not to become rough. Therefore, with the use of 300-series stainless steels, the glossiness of the plated surface can be easily improved, and accordingly, the reflectivity of the light from the light emitting element can be improved, so that a light emitting device having high light extraction efficiency can be obtained.

A preferable thickness of the supporting substrate can be obtained by using a planar member of about 10 μm to 300 μm thickness, and a processing may be carried out to provide a shape such as a slit, a groove, or a wave-shape on the supporting substrate to reduce a degree of warpage which may occur after resin molding.

(Metallic Layer)

The metallic layer according to Embodiments 1 or 2 is provided on the supporting substrate made of the stainless steel, and contains a metal having a diffusion coefficient with respect to Au smaller than a diffusion coefficient of a metal in the supporting substrate with respect to Au. With this arrangement, the metallic layer serves as a barrier layer which prevent diffusion of Fe, Ni, Cr and the like contained in the supporting member into the first layer of the conductive member caused by the heat applied to bond the light emitting element to the conductive members. As a result, generation of an alloy between the supporting substrate and the conductive member can be prevented, so that the supporting substrate can be easily removed in a later step, and light emitting devices can be obtained with a good manufacturing yield. Examples of preferable materials for such a metallic layer include Ti, Pt, Pd, Al, Rh, and Mo. The thickness of the metallic layer is preferably about 0.02 μm to 5 μm, more preferably about 0.02 μm to 1 μm. The metallic layer can be formed by way of plating, in the same manner as in the conductive member, and can also be formed by using other methods such as sputtering or vapor deposition.

(Conductive Member)

In the present embodiment, the conductive member is employed to serve as a pair of electrode which are directly or indirectly electrically connected to the light emitting element to conduct the electric current supplied from outside to the light emitting element. At least one of the conductive member has a size capable of mounting the light emitting element and the other has a size capable of connecting a conductive wire. The first layer (Au) is exposed at the lower surface of the conductive member to constitute an external surface of the light emitting device. With this arrangement, the conductive member can serve as the electrode having excellent adhesion with a circuit board, and good electric conduction can be obtained.

In Embodiments 1 or 2. the conductive member has a first layer having Au as its main component and a second layer having a metal different from Au as its main component on the first layer. The first layer of the conductive member having Au as its main component is exposed at the back surface of the light emitting device after removing the supporting substrate and the metallic layer, and has an excellent wettability to the solder used in the mounting to the circuit board. Therefore, the first layer is made mainly of Au, preferably of Au, and further plating step is not needed. The thickness of the first layer is preferably about 0.04 μm to 1 μm, more preferably about 0.1 to 0.5 μm.

The second layer of the conductive member is a layer having a metal different from Au as its main component, in which copper, nickel, iron, palladium, or the like, can be preferably used according to the aim and application. For example, in order to improve mechanical strength of the conductive member and the light emitting device, Ni which has a high corrosion resistance is preferably employed as the main component. In order to improve heat dissipating properties, Cu which has a high thermal conductivity is employed. Thus, the main component of the second layer of the conductive film can be variously selected according to the aim and application. These metals can be used singly, but in view of mechanical strength, adhesion, suitability for mass production, cost effectiveness, and the like, an alloy with other metals may also be employed. Further, such a layer may be stacked between the first layer and the second layer, or on the second layer. Examples of such material include metals such as aluminum, gold, silver, tungsten, molybdenum, cobalt and an alloy thereof (such as an iron-nickel alloy), eutectic solder materials such as phosphor bronze, iron-containing copper, and AuSn, solders such as SnAgCu and SnAgCuIn, and ITO or the like. A particularly preferable material among the solder materials has a composition adjusted so that once the solder particles are melted and solidified, an alloy between a metal that is to be bonded and the solder is formed and the melting point rises, and so that remelting does not occur in an additional thermal treatment such as reflow mounting. The thickness of the second layer is preferably about 0.04 μm to 200 μm, more preferably about 40 to 80 μm.

Moreover, the outermost surface (top surface) of the conductive member is preferably provided with a material capable of reflecting light from the light emitting element and/or a wavelength converting member, examples thereof include gold, silver, copper, Pt, Pd, Al, W, Mo, Ru, and Rh. Further, the conductive member at the outermost surface preferably has a high reflectivity and a high glossiness. The reflectivity in the visible region is preferably 70% or higher, and in that case, Au, Al, Ag, Ru, Rh, Pt, Pd, and the like is preferable, and particularly, Ag is preferable. It is also preferable that the conductive member has a high-gloss surface. In particular, the gloss value is preferably 0.5 or greater, more preferably 1.0 or greater. The gloss value shown in the specification is a value measured using a micro surface color difference meter VSR 300A manufactured by NIPPON DENSHOKU INDUSTRIES CO., LTD., under a condition of illumination angle of 45° and vertical light receiving. It is preferable that the supporting substrate side of the conductive member is made of Au, Sn, a Sn-alloy, an eutectic solder such as AuSn, or the like, which are advantageous for mounting to a circuit board and the like.

Such a conductive member as described above is preferably a plated layer formed by using a plating method, and is particularly preferably a stack of plated layers.

The conductive member preferably has a linear expansion coefficient relatively close to that of the supporting substrate. For example, in a case where the supporting substrate is made of SUS 430 that has a linear expansion coefficient of $10.4 \times 10^{-6}$/K, it is preferable that the conductive member formed on the supporting substrate has a stacked layer structure of such as, a first layer of Au (0.04 to 0.1 μm) with a linear expansion coefficient of $14.2 \times 10^{-6}$/K, a second layer of Ni with a linear expansion coefficient of $12.8 \times 10^{-6}$/K (or Cu with a linear expansion coefficient of $16.8 \times 10^{-6}$/K) (40 to 70 μm)/Au (0.01 to 0.07 μm), and the top layer of Ag with a linear expansion coefficient of $119.7 \times 10^{-6}$/K (2 to 6 μm). Ag, which has a linear expansion coefficient significantly different from that of the metals in other layers, is employed as the top layer to give priority to reflectance of light from the light emitting element, and is formed as an ultrathin layer. Therefore, it has little effect on warpage and is thus sufficient for practical use.

On the other hand, in Embodiments 3 to 5. the lower surface of the bottom layer of the conductive member has a first region containing Au and a second region containing a metallic member having a diffusion coefficient with respect to a metal in the stainless steel smaller than a diffusion coefficient of Au with respect to the metal in the stainless steel. Exposure of Au at the lower surface of the conductive member allows it to serve as an electrode having excellent adhesion with a circuit board, so that a good electric conduction can be obtained. Further, the second region, which contains the metal having a small diffusion coefficient to the metal in the supporting substrate made of a stainless steel and thus an alloy layer is hardly formed in the manufacturing steps, is exposed at the lower surface of the conductive member. Accordingly, the conductive member can be prevented from breaking or detaching at the time of removing the supporting substrate. Thus, light emitting devices can be obtained with good yield.

Moreover, in Embodiments 3 to 5. the bottom layer including the first region and the second region of the conductive member is exposed at the lower surface of the light emitting device after the supporting substrate is removed. Although the first region and the second region have different properties, both the regions are respectively made of a conductive metal. Therefore, good connection with the circuit board can be obtained without significantly decreasing the electric resistance. It is sufficient that the first region and the second region is formed so as to be exposed at the lower surface of the conductive member, and is preferable that a different metallic member is further formed on the first and the second regions, and particularly preferable that Au constituting the first region is formed on the second region continuously from the first region. Also, the layer including the first region and the second region is used as the bottom layer, and a layer made of further different metallic member may be stacked on the layer described above. Stacking of layers will be described later. In a case where the metallic member constituting the second region has a thickness larger than that of Au constituting the first region, that is, for example, the metallic member constituting the second region is disposed extending into the intermediate layer $301y$ as shown in FIG. 3D(c), the layer containing Au and the second region is used as the bottom layer.

The first region and the second region may be formed with the same area, or one of the regions may be formed larger then the other under each of the plurality of conductive members. For example, more than two heating steps, such as curing resin and curing adhesive member, are included in the manufacturing process, and in a case where the temperature in the heating step which requires the highest temperature among the heating step is relatively low, such as at about 250° C. and below, an alloy layer is not easily formed at the interface between the first region containing Au and the supporting substrate made of a stainless steel. Therefore, in this case, the first region is preferably formed in a larger area than the second region and, accordingly, the adhesion between the individual light emitting device and its corresponding circuit board can be improved. In a case where the heating temperature in a step is 250° C. and above, the second region is preferably formed in a larger area than the first region. With this arrangement, formation of an alloy layer can be suppressed and manufacturing can be facilitated with good yield.

The first region and the second region at the lower surface of the conductive member can be formed in an appropriate shape. For example, in a case where the second region is formed firstly and then the first region is formed, the arrangement may be such that the shape of the second region is variously selected and after forming the second region, the first region is formed so as to surround the second region. For example, as shown in FIG. 3C(a), a square shape is arranged in a regular manner in matrix as the second region $301b$. and the first region $301a$ is formed to surround the second region. Alternatively, as shown in FIG. 3C(b), the second region $301b'$ is formed in a grid shape and the first region $301a'$ is formed in each space in the grid, to obtain an arrangement having the first region $301a'$ surrounded by the second region $301b'$. Other than those described above, an arrangement in which a dot-shape, a stripe-shape, a polygonal shape, and the like can be used singly or in combination of two or more, each with one or more sizes, with an arrangement in regular or irregular manner, or in indeterminate shape and size. Such a shape can be easily formed by selecting the shape of the mask (which includes such as a resist) used at the time of forming the first region.

The first region is exposed at the lower surface of the conductive member and made of Au having excellent wettability with the solder used in the mounting to the circuit board. Au and a stainless steel are such that, in a high heating temperature, increasing amount of a metal diffuses through the interface in the both directions or in one direction, and particularly, Fe, Ni, and Cr in the stainless steel become easily diffuse into Au. Particularly, the highest temperature is applied in the step of bonding the light emitting element on the conductive member by using an adhesive member containing a metal. At this time, heating is carried out at a temperature of about 200 to 380° C. In such a temperature range, the diffusion coefficient between Au and a metal (Fe, Ni, Cr, and the like) in the stainless steel is particularly large, and specifically create an environment in which Fe, Ni, Cr, and the like are easily diffuse into Au. In the present embodiment, those first regions are provided not entirely but partially on the lower surface of the conductive member. That is, the region which allows easy diffusion is limited to a partial region, and thus enables controlling the area of alloy layer. Moreover, the first region is in contact with the second region that does not easily form an alloy layer at the interface with the stainless steel, so that the adhesion between the both regions is enhanced, enables to prevent the first region and second region from breaking or chipping. The thickness of the first layer is preferably about 0.04 μm to 1 μm, more preferably about 0.1 to 0.5 μm. The thickness of the first region can be the same as, or either thicker or thinner than that of the second region. Such a first region can be formed by way of nonelectrolytic plating or electrolytic plating, and particularly, electrolytic plating is preferably employed, which facilitates removing of the resist (protective film) and formation of the conductive member with sufficiently uniform shape.

The second region is exposed at the lower surface of the conductive member in the same manner as the first region, and is constituted with a metallic member having a diffusion coefficient to a metal in the stainless steel smaller than a diffusion coefficient of Au with respect to the metal in the stainless steel, that is, a metallic member which is more difficult to form an alloy with the stainless steel that is the supporting substrate than Au. Providing such a region enables to prevent formation of an alloy layer at the entire interface between the conductive member and the stainless steel which impedes removal of the stainless steel. Thus, the light emitting devices can be obtained with good yield. Particularly preferable is a metallic member having a diffusion coefficient to Fe, Ni, Cr, and the like, which are main constituting metal, smaller than a diffusion coefficient of Au with respect to such a metal in the stainless steel. With this arrangement, diffusion of the metals in the stainless steel and the metals in the second region is impeded either in the both directions or in one direction, that is, the second region can serve as a barrier layer which does not form an alloy layer easily. Such a second region can also be provided on the entire lower surface of the conductive member. However, in such case, after removing the supporting substrate, only the second region made of a metal different from Au is exposed at the lower surface of the conductive member. For this reason, in view of mountability to a circuit board, it is preferable to repeat Au plating a second time. However, an increase in the number of steps in processing the group of thin-type light emitting devices after removing respective supporting substrates is not desirable. Therefore, Au is preferably provided in the bottom surface in a step before removing the supporting substrate as in the present embodiment.

Examples of the preferable materials for the metallic member constituting the second region of the conductive member include, similar to that for the metallic layer in Embodiments 1 or 2, at least one selected from Ti, Pt, Pd, Al, Rh, and Mo, and Ti and Pt are particularly preferable. Those metallic members have a diffusion coefficient to a metal (Fe, Ni, and Cr in particular) in the stainless steel smaller than a diffusion coefficient of Au with respect to the metal in the stainless steel, so that they can serve as a barrier layer. The thickness of the second region is preferably about 0.02 µm to 5 µm, further preferably about 0.02 µm to 1 µm, particularly preferably have an approximately same thickness as that of Au constituting the first region. The second region can be formed by way of plating, in the same manner as in the first region, and can also be formed by using other methods such as sputtering or vapor deposition.

The thickness of the conductive member is preferably about 10 µm to 100 µm, particularly preferably about 45 µm to 95 µm. With a thickness in the range described above, the conductive member can be formed with a relatively uniform thickness. Particularly, it is preferable to form a stacked layer by way of plating.

The layer having the first region and the second region as described above is used as the bottom layer, one ore more metallic layers can be further stacked on the bottom layer.

The top layer or the outermost surface (top surface) of the conductive member, on which a light emitting element to be mounted, is preferably provided with a material capable of reflecting light from the light emitting element and/or a wavelength converting member, examples thereof include gold, silver, copper, Pt, Pd, Al, W, Mo, Ru, and Rh. Further, the conductive member at the outermost surface preferably has a high reflectivity and a high glossiness. The reflectivity in the visible region is preferably 70% or higher, and in that case, Au, Al, Ag, Ru, Rh, Pt, Pd, and the like is preferable, and particularly, Ag is preferable. It is also preferable that the conductive member has a high-gloss surface. In particular, the gloss value is preferably 0.5 or greater, more preferably 1.0 or greater. The gloss value shown in the specification is a value measured using a micro surface color difference meter VSR 300A manufactured by NIPPON DENSHOKU INDUSTRIES CO., LTD., under a condition of illumination angle of 45° and vertical light receiving. It is preferable that the supporting substrate side of the conductive member is made of Au, Sn, a Sn-alloy, an eutectic solder such as AuSn, or the like, which are advantageous for mounting to a circuit board and the like.

Also, an intermediate layer is preferably provided between the bottom layer having the lower surface which include the first region and the second region described above, and the top layer on which the light emitting element to be mounted. According to its aim and application, an appropriate member is preferably used for the intermediate layer, for example, in order to improve the mechanical strength of the conductive member and the light emitting device, a metal having high corrosion resistance such as Ni is preferably used, and in order to improve the heat dissipating properties, copper which has a high thermal conductance is preferably used. For the intermediate layer, as well as the metals described above, Pt, Pd, Al, W, Ru, Pd, and the like can be used, also, a stacked layer of one or more metals having good adhesion with the metals contained in the top layer and/or the bottom layer can be employed The intermediate layer preferably has a thickness larger than that of the top layer or the bottom layer.

In a case where the plated layer is made of metal elements, the linear expansion coefficient depends on the composition thereof. Therefore, the bottom layer and the intermediate layer preferably have a linear expansion coefficient relatively close to that of the supporting substrate. For example, using a supporting substrate made of SUS 430 that has a linear expansion coefficient of $10.4 \times 10^{-6}$/K, it is preferable that the conductive member formed on the supporting substrate has a stacked layer structure of such as, from the bottom layer side; Au (0.04 to 0.1 µm) with a linear expansion coefficient of $10.4 \times 10^{-6}$/K/Ni with a linear expansion coefficient of $12.8 \times 10^{-6}$/K (or Cu with a linear expansion coefficient of $16.8 \times 10^{-6}$/K) (40 to 70 µm)/Au (0.01 to 0.07 µm)/Ag with a linear expansion coefficient of $119.7 \times 10^{-6}$/K (2 to 6 µm). Ag, which has a linear expansion coefficient significantly different from that of the metals in other layers, is employed as the top layer to give priority to reflectance of light from the light emitting element, and is formed as an ultrathin layer. Therefore, it has little effect on warpage and is thus sufficient for practical use.

The side surfaces of the conductive member may be flat, but in view of adhesion with the base member, a shape having a protrusion such as shown in FIG. 1B, FIG. 3B, and FIG. 5D is preferably employed. It is preferable that each of the protrusions is provided at a position spaced apart from the lower surface of the conductive member 101, 301, and 501 respectively. Accordingly, problems such as detachment of the conductive member 101, 301, 501 from the base member 103, 503 can be avoided. Such a protrusion can be provided at an appropriate position in the periphery of the conductive member. For example, the protrusion may be provided at a part of the periphery, such as at only two opposite side surfaces of a conductive member having a quadrilateral shape in top view. In order to reliably prevent such a detachment, it is preferable to form the protrusion along the entire periphery of the conductive member.

(Base Member)

In the present embodiment, the base member is made of resin provided with a recess defined by a bottom surface portion and side walls, and is provided between a pair of conductive members, and the resin is capable of blocking light from a light emitting element, with the addition of various light-blocking filler materials. The provision of such light-blocking base member enables to prevent light of the light emitting element from leaking out from the lower surface (back surface) of the light emitting device, so that the efficiency of extracting light in an upper surface direction can be improved. A base member lacking the side wall portion, that is, a base member including only the bottom surface portion may also be employed. Both the bottom surface portion and the side wall portion of the base member need to have a thickness sufficient to prevent leakage of light from the light emitting element.

The base member can be made of any members capable of blocking light from the light emitting element, and a member having a linear expansion coefficient similar to that of the supporting substrate is preferable. Further, an insulating member is preferably used. Examples of the preferable materials include a resin such as a thermosetting resin or a thermoplastic resin. Particularly in a case where the conductive member has a very small thickness such as about 25 μm to 200 μm, a thermosetting resin is preferable to obtain a very thin base member. Specific examples include, an epoxy resin composition, a silicone resin composition, a modified epoxy resin composition such as a silicone-modified epoxy resin, a modified silicone resin composition such as an epoxy-modified silicone resin composition, a polyimide resin composition, and a modified polyimide resin composition.

Particularly, a thermosetting resin, such as that described in JP 2006-156704A is preferable. Among the thermosetting resin, for example, an epoxy resin, a modified epoxy resin, a silicone resin, a modified silicone resin, an acrylate resin, a urethane resin and the like are preferably used. More specifically, it is preferable to use a solid epoxy resin composition that contains a colorless and transparent mixture prepared by mixing and dissolving the equivalent quantities of (i) an epoxy resin composed of triglycidyl isocyanurate and hydrogenated bisphenol A triglycidyl ether and (ii) an acid anhydride composed of hexahydrophthalic anhydride, 3-methyl-hexahydrophthalic anhydride and 4-methyl-hexahydrophthalic anhydride. It is further preferable to use a B-stage solid epoxy resin composition obtained by adding 0.5 parts by weight of DBU (1,8-diazabicyclo(5,4,0)undecene-7) as a curing accelerator, 1 part by weight of ethylene glycol as a co-catalyst, 10 parts by weight of a titanium oxide pigment, and 50 parts by weight of a glass fiber to 100 parts by weight of the mixture described above, and applying heat to partially cure it.

It is also preferable to use a thermosetting epoxy resin composition whose essential component is an epoxy resin containing a triazine derivative epoxy resin described in WO 2007/015426. For example, a 1,3,5-triazine derivative epoxy resin is preferably contained. In particular, an epoxy resin having isocyanurate rings has excellent light resistance and electrical insulation. It is desirable to have a divalent, more preferably trivalent epoxy group per isocyanurate ring. Specifically, tris(2,3-epoxypropyl)isocyanurate, tris(α-methylglycidyl)isocyanurate or the like may be used. The triazine derivative epoxy resin preferably has a softening point of 90 to 125° C. The triazine derivative epoxy resin may also be used with a hydrogenated epoxy resin or other epoxy resins. Further, in a case where a silicone resin composition is used, a silicone resin that contains a methyl-silicone resin is preferably used.

A case employing a triazine derivative epoxy resin will be described below specifically. It is preferable to use an acid anhydride that acts as a curing agent on the triazine derivative epoxy resin. Specifically, using of an acid anhydride non-aromatic that is non-aromatic and does not include a carbon-carbon double bond allows an improvement of light resistance. Examples thereof include hexahydrophthalic anhydride, methyl-hexahydrophthalic anhydride, trialkyltetrahydrophthalic anhydride, and hydrogenated methylnadic anhydride, and among them, methyl-hexahydrophthalic anhydride is particularly preferable. It is also preferable to use an antioxidant such as phenolic and sulfuric antioxidant.

A filler for providing light resistance and, if required, various additives may be added to those resins. In the present embodiment, such resins together with those additives will be referred to as "light-blocking resin". For example, it is preferable to adjust transmissivity to light by mixing fine particles of $TiO_2$, $SiO_2$, $Al_2O_3$, MgO, $MgCO_3$, $CaCO_3$, $Mg(OH)_2$, $Ca(OH)_2$ or the like as the filler to block about 60% or more, more preferably about 90% of light from the light emitting element. In the present embodiment, light is blocked either by reflecting or by absorbing at the base member, but in a case where the light emitting device is used for application such as lighting, it is more preferable to block light by reflecting it. For this reason, the light-blocking resin preferably has a reflectivity of 60% or more, more preferably 90% or more, with respect to the light from the light emitting element.

The filler materials described above may be used singly or in combination. For example, a filler for adjusting the reflectivity and a filler for adjusting the linear expansion coefficient described later may be used together.

For example, in a case where $TiO_2$ is used as a white filler, it is preferably added at 10 to 30 wt %, more preferably at 15 to 25 wt %. $TiO_2$ of either rutile type or anatase type may be used. In view of light-blocking property and light-resistance property, the rutile type is preferable. Further, in a case where an improvement in dispersibility and light resistance are intended, a filler modified by surface treatment can also be used. Oxide hydrate or oxide such as alumina, silica, zinc oxide may be used in such surface treatment of a filler made of $TiO_2$. In addition to those described above, $SiO_2$ is preferably added in a range of 60 to 80 wt %, more preferably of 65 to 75 wt % as a filler for mainly adjusting the linear expansion coefficient. For the $SiO_2$ described above, the amorphous silica that has smaller linear expansion coefficient that that of the crystalline silica is preferably employed. The filler preferably has a particle size of 100 μm or less, more preferably 60 μm or less. Further, particle shape of the filler is preferably spherical which can improve the filling efficiency at the time of molding the base member. In order to improve image contrast in the application such as display, the filler preferably has light absorption of 60% or more, more preferably 90% or more, with respect to the light emitted from the light emitting element. In this case, examples of a filler to be used in a specific application include a carbon such as acetylene black, activated carbon and graphite, an oxide of transition metal such as iron oxide, manganese dioxide, cobalt oxide or molybdenum oxide, and an organic pigment.

It is preferable that the difference in the linear expansion coefficient between the base member and the supporting substrate which to be removed (detached) before individually separating the devices is small. The difference is preferably 30% or less, more preferably 10% or less. In a case where a SUS plate is used for the supporting substrate, the difference in the linear expansion coefficient is preferably 20 ppm or less, more preferably 10 ppm or less. In this case, the content of the filler is preferably 70 wt % or more, more preferably 85% or more. With this arrangement, the residual stress in the supporting substrate and the base member can be controlled (relaxed), so that warpage in the group of the optical devices before being individually separated can be reduced. Reducing the warpage allows reducing the damage to inside the devices such as disconnection of conductive wire, and suppressing positional error at the time to individually separating the devices, so that good yield in manufacturing can be obtained. For example, the linear expansion coefficient of the base member is preferably adjusted in a range of $5 \times 10^{-6}$/K to $25 \times 10^{-6}$/K, and more preferably in a range of $7 \times 10^{-6}$/K to $15 \times 10^{-6}$/K. With this, generation of warpage can be easier to suppress during cooling step after forming the base bodies, so that good yield in manufacturing can be obtained. In the present specification, the term "linear expansion coefficient" refers to the linear expansion coefficient of the base member, that is formed from the light-blocking resin prepared with addition of various fillers, at a temperature below the glass transition temperature thereof. It is preferable to employ a material having a linear expansion coefficient close to that of the supporting substrate at the temperature range described above.

From another point of view, it is preferable to control the difference in the linear expansion coefficient between the base member and the conductive member is preferably adjusted so that the difference in the linear expansion coefficient to be small. The difference is preferably 40% or less, more preferably 20% or less. Accordingly, the conductive members and the base member can be prevented from detaching in the individually separated light emitting devices. Thus, light emitting devices having high reliability can be obtained.

(Sealing Member)

The sealing member is provided to protect the electric components such as a light emitting element, a light receiving element, a protective element and a conductive wire from dust, moisture, external force, or the like. In the present embodiment, the sealing member is filled in the recess S in the base member 103, as shown in FIG. 3A and FIG. 3B.

The sealing member is preferably formed from a material having optical transmissivity which allows the light from the light emitting element to transmit therethrough, and having light resistance against deterioration by such light. Examples of the material thereof include an insulating resin composition having optical transmissivity which allows the light from the light emitting element to transmit therethrough, such as a silicone resin composition, a modified silicone resin composition, an epoxy resin composition, a modified epoxy resin composition, an acrylic resin composition. Also, a silicone resin, an epoxy resin, a urea resin, a fluororesin and a hybrid resin containing at least one of these resins may be used. The material is not limited to those organic materials described above, and an inorganic material such as glass or silica sol may also be used. In addition to these materials, a coloring agent, a light diffusing agent, a light reflecting material, various fillers, a wavelength converting material (a fluorescent material) or the like may also be contained as required. The amount of the sealing member that is capable of covering the electric components described above is sufficient.

The sealing member may be formed with various external shapes according to the factors such as the light distribution characteristics. The light distribution characteristics can be adjusted by, for example, forming the upper surface in a shape such as a convex lens, a concave lens, or Fresnel lens. Also, in addition to the sealing member, a lens member may be provided. In a case where a molded member containing a fluorescent material such as molded sheet member containing a fluorescent material or molded dome member containing a fluorescent material is used, the sealing member is preferably formed from a material having excellent adhesion with such a molded member. The molded member containing fluorescent material can be formed by using an inorganic material such as glass, as well as by using a resin composition.

While the light emitting devices have been described, substantially the same as described above applies also to a light receiving device, in which, a colored filler such as white or black may be used as the sealing member so as to increase the efficiency of receiving light and to avoid secondary reflection within the light receiving device. Also it is preferable to use a sealing member that contains a black filler in an infrared ray emitting device or an infrared ray detecting apparatus, in order to avoid interference with visible light.

A resin used as the sealing member described above may be used to integrally hold the conductive member and each of the electric components mounted on the conductive member as an alternative to the base member made of a light-blocking resin described above.

(Adhesive Member)

An adhesive member is used to connect the light emitting element and the conductive members. Materials such as resins and metals can be used for the adhesive member, but resins having excellent heat resistance and members containing a metal are preferable and members made of a metal are more preferable. Specific examples of the resins having excellent heat resistance include epoxy resin compositions, silicone resin compositions, polyimide resin compositions and modified resin of those resins, and hybrid resins, and among those, hybrid resins are particularly preferable.

Also preferable for the adhesive member is a member which contains a metal and is capable of bonding the light emitting element and the conductive members by melting at a temperature lower than the melting point of the metal. Such an adhesive member has excellent heat resistance and is able to endure high temperature generated during high power operation, so that it is resistant to degradation and can sustain adhesion. Examples of preferable materials for the adhesive member include, a conductive paste of silver, gold, palladium, a eutectic solder material such as AuSn, and a brazing material such as a low melting temperature metal. Some of those materials described above require a heating step at a relatively high temperature with respect to other steps in the manufacture. For example, AuSn eutectic solder is heated to a temperature about 270 to 340° C. Under this environment, Au and metals in the stainless steel easily diffuse in the both directions or in one direction at the interface between the bottom layer of the conductive member and the stainless steel that is the supporting substrate. Particularly, the eutectic solder materials Au—Sn 10/90 and Au—Sn 80/20 have the eutectic temperature in a range of 280 to 320° C. and have high flowability and wettability, so that strong adhesion with the light emitting element can be obtained. In Embodiment 3. the second region is provided containing a metallic member having a diffusion coefficient with respect to a metal in the stainless steel smaller than a diffusion coefficient of Au with respect to the metal in the stainless steel, therefore, the stainless steel can be removed relatively easily, and with a good yield. With the use of a metal or a resin having excellent heat resistance as described above, the adhesive member obtained resistance to degradation against high temperatures generated during high power operation and can sustain adhesion.

(Conductive Wire)

The conductive wires that directly or indirectly connect the electrodes of the light emitting element and the respective conductive members may be made of a metal such as gold, copper, platinum, aluminum or the like, or an alloy thereof. It is particularly preferable to use gold that has excellent thermal resistance etc.

(Wavelength Converting Member)

The sealing member may include a fluorescent member as the wavelength converting member that absorbs at least a part of light emitted from the light emitting element and emits light of different wavelength.

A fluorescent member capable of converting light from a light emitting element into light of a longer wavelength has a higher efficiency. However, the fluorescent member is not limited to this, and various fluorescent members such as one capable of converting light emitted from a light emitting element into light of a shorter wavelength, or one capable of converting light that has been converted by other fluorescent member, may also be used. Such a wavelength converting member may be made of a single layer of one kind of fluorescent member, a single layer of a mixture of two or more kinds of fluorescent members, a stacked layer of two or more single layers containing one kind of fluorescent member, or a stacked layer of two or more single layers each containing a mixture of two or more kinds of fluorescent members.

The fluorescent member is sufficient that, for example, in a case where a semiconductor light element having a nitride-based semiconductor as its light emitting layer is employed as the light emitting element, it is capable of absorbing light from the light emitting element and emitting light of different wavelength. For example, it is preferable to use at least one selected from nitride-based fluorescent materials and oxynitride-based fluorescent materials, activated mainly with lanthanoid elements such as Eu or Ce, which are more specifically described as follows: (a) α- or β-sialon-based fluorescent materials, various alkaline-earth metal nitride silicate fluorescent materials, and various alkaline earth-metal aluminum nitride silicate fluorescent materials, activated with Eu (for example, $CaSiAlN_3$:Eu, $SrAlSi_4N_7$:Eu); (b) alkaline-earth metal halogen apatites, alkaline-earth metal halosilicates, alkaline-earth metal silicates, alkaline-earth metal haloborates, alkaline-earth metal aluminates, alkaline-earth metal sulfides, alkaline-earth metal thiogallates, and alkaline-earth metal silicon nitrides or germanates, activated mainly with lanthanoid elements such as Eu or transition metal elements such as Mn; (c) rare-earth aluminates, rare-earth silicates and alkaline-earth metal rare-earth silicates, activated mainly with lanthanoid elements such as Ce; and (d) organic compounds and organic complexes activated mainly with lanthanoid elements such as Eu. A YAG-based fluorescent material is preferably used. YAG fluorescent materials are rare-earth aluminate fluorescent materials activated mainly with lanthanoid elements such as Ce, and represented by compositional formulas such as $Y_3Al_5O_{12}$:Ce, $(Y_{0.8}Gd_{0.2})_3Al_5O_{12}$:Ce, $Y_3(Al_{0.8}Ga_{0.2})_5O_2$:Ce, $(Y, Gd)_3(Al, Ga)_5O_{12}$. Examples of rare-earth aluminate fluorescent materials also include $Tb_3Al_5O_{12}$:Ce and $Lu_3Al_5O_{12}$:Ce, formed by substituting a part or all of Y with Tb or Lu. Moreover, fluorescent members other than those described above, having similar properties, performance, and effects can also be used.

A member made of a molded article such as glass and resin composition and coated with a fluorescent member can also be used. Further, a molded article containing a fluorescent member can also be used. Specifically, glass containing a fluorescent member, sintered YAG, a mixed sintered material of YAG and $Al_2O_3$, $SiO_2$, $B_2O_3$, or the like, a bulk of a crystallized inorganic material in which YAG is precipitated in a molten inorganic material can be used, and also, an integrally molded article made of a fluorescent member and epoxy, silicone, or hybrid resin can be used.

(Light Emitting Element)

In the present embodiment, a semiconductor element of various structures, such as a structure having the positive and negative electrodes formed on the same side, a structure having the positive and negative electrodes formed on different sides, and a structure having a substrate different from the growth-substrate bonded together, can be employed as the light emitting element.

The semiconductor light emitting element of any appropriate wavelength can be employed. For example, for the light emitting element capable of emitting blue or green light, ZnSe, nitride-based semiconductor ($In_XAl_YGa_{1-X-Y}N$, $0 \leq X$, $0 \leq Y$, $X+Y \leq 1$), or GaP may be employed. For the light emitting element capable of emitting red light, GaAlAs, AlInGaP, or the like may be employed. A semiconductor light emitting element made of a material other than the above may also be employed. Composition, color of emitted light, size and number of the light emitting element to be employed can be selected appropriately according to the purpose.

In a case where a light emitting device having a wavelength converting member is to obtain, it is suitable to employ a nitride semiconductor ($In_XAl_YGa_{1-X-Y}N$, $0 \leq X$, $0 \leq Y$, $X+Y \leq 1$) capable of emitting light of a short wavelength that can efficiently excite the wavelength converting member. The emission wavelength can be variously selected by the materials and the content ratio of the mixed crystal of the semiconductor layer.

A light emitting element capable of emitting ultraviolet light or infrared light can also be employed as well as a light emitting element capable of emitting visible light. Moreover, a light receiving element or the like may be mounted singly or with the light emitting element, and also a protective element or the like can also be mounted. Such an element can be bonded directly on a conductive member by using an adhesive member, or the conductive member may be indirectly mounted via another member such as a pedestal member.

The light emitting devices according to the present invention are compact and light in weight, and have high light extraction efficiency, and can be used in various display apparatuses, illumination apparatuses, displays, backlight source for liquid crystal displays, etc.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

The present application is based on Application No. 2009-177611 filed in Japan on Jul. 30, 2009 and Application No. 2009-180452 filed in Japan on Aug. 3, 2009. the contents of which are incorporated herein by references.

What is claimed is:

1. A method of manufacturing a light emitting device comprising:
   a first step of forming a metallic layer on a supporting substrate made of a stainless steel, the metallic layer comprising a metal having a diffusion coefficient with respect to Au smaller than a diffusion coefficient of a metal contained in the supporting substrate with respect to the Au;
   forming a plurality of conductive members spaced apart from each other on the metallic layer, each of the plurality of conductive members comprising a first region containing the Au, and a second region disposed on at least a part of the first region and the supporting substrate, the second region comprising a metallic member having a diffusion coefficient with respect to the metal contained in the supporting substrate smaller than a diffusion coefficient of the Au with respect to the metal contained in the supporting substrate, and
   forming a first layer of the each of the plurality of conductive members as the first region on the metallic layer, the first layer having the Au as its main component, and a second layer as the second region formed on the first layer, the second layer containing a metal other than the Au as its main component;
   a second step of forming at least one base member made of a light-blocking resin on the supporting substrate at locations having the first region of conductive member, and forming a plurality of additional base members made of a light blocking resin on the supporting substrate or the metallic layer exposed at locations between the plurality of conductive members;

a third step of bonding at least one light emitting element on an upper surface of a second region of the conductive member through an adhesive member, wherein the third step comprises, mounting a plurality of light emitting elements on each upper surface of the plurality of conductive members or base members through at least one adhesive member containing a metal, and applying heat at a temperature lower than the melting point of the metallic layer to melt the at least one adhesive member;

a fourth step of covering the light emitting element with an optically transmissive sealing member; and a fifth step of removing the supporting substrate so as to expose at least a part of the first region of the conductive member, wherein the fifth step comprises, removing the supporting substrate by detaching between the metallic layer and the first layer and individually separating the light emitting device.

2. The method of manufacturing a light emitting device according to claim 1, wherein the first step of forming the plurality of conductive members includes: forming a protective film provided with a plurality of openings after forming the metallic layer on the supporting substrate, and forming the conductive member in the plurality of openings.

3. The method of manufacturing a light emitting device according to claim 1, wherein the first step of forming the plurality of conductive members includes: after forming a protective film defining a plurality of openings on the supporting substrate, disposing the metallic layer in each opening.

4. The method of manufacturing a light emitting device according to claim 1, wherein the first step of forming the plurality of conductive members further includes a step of applying heat at a temperature higher than the temperature applied in the third step of bonding the light emitting element.

5. The method of manufacturing a light emitting device according to claim 1, wherein the metallic layer contains one selected from Ti, Pt, Pd, Al, Rh, and Mo.

6. The method of manufacturing a light emitting device according to claim 1, wherein the adhesive member is a eutectic material.

7. A method of manufacturing a light emitting device comprising:

a first step of forming a plurality of conductive members spaced apart from each other on a supporting substrate made of a stainless steel, the plurality of conductive members comprising a first region containing Au and a second region interposed between at least a part of the first region and the supporting substrate, the second region comprising a metallic member having a diffusion coefficient with respect to a metal contained in the supporting substrate smaller than a diffusion coefficient of Au with respect to the metal contained in the supporting substrate, wherein each of the plurality of conductive members comprises a bottom layer including the first region and the second region, the first region containing the Au and the second region containing a metallic member having a diffusion coefficient with respect to a metal contained in the supporting substrate smaller than a diffusion coefficient of the Au with respect to the metal contained in the supporting substrate;

a second step of forming a base member made of a light-blocking resin on the supporting substrate at locations having the first region of conductive member, wherein, in the second step, a base member made of a light-blocking resin is formed on the supporting substrate between the conductive members;

a third step of bonding a light emitting element on an upper surface of a first region of the conductive member through an adhesive member;

a fourth step of covering the light emitting element with an optically transmissive sealing member; and a fifth step of removing the supporting substrate so as to expose at least a part of the first region of the conductive member and individually separating each light emitting device, wherein, in the fifth step, the light emitting devices are individually separated after removing the supporting substrate.

8. The method of manufacturing a light emitting device according to claim 7, wherein the first step of forming the plurality of conductive members further includes a step of forming the first region continuously on the supporting substrate and over the second region.

9. The method of manufacturing a light emitting device according to claim 7, wherein the first step of forming the plurality of conductive members further includes a step of forming at least an intermediate layer containing a metal different from the metal contained in the bottom layer, and a top layer on which the light emitting element is to be mounted, in this sequence on the bottom layer by way of plating.

* * * * *